(12) United States Patent
Hirai et al.

(10) Patent No.: US 10,941,323 B2
(45) Date of Patent: Mar. 9, 2021

(54) COMPOSITE OF METAL AND RESIN

(71) Applicant: ADVANCED TECHNOLOGIES, INC., Gotenba (JP)

(72) Inventors: Kinji Hirai, Kawasaki (JP); Isamu Akiyama, Yokohama (JP); Tsukasa Takahashi, Gotenba (JP); Takutaka Sugaya, Gotenba (JP); Yuka Muto, Gotenba (JP)

(73) Assignee: ADVANCED TECHNOLOGIES, INC., Gotenba (JP)

( * ) Notice: Subject to any disclaimer, the term of this patent is extended or adjusted under 35 U.S.C. 154(b) by 0 days.

(21) Appl. No.: 16/635,660

(22) PCT Filed: May 14, 2018

(86) PCT No.: PCT/JP2018/018588
§ 371 (c)(1),
(2) Date: Jan. 31, 2020

(87) PCT Pub. No.: WO2019/026382
PCT Pub. Date: Feb. 7, 2019

(65) Prior Publication Data
US 2020/0377767 A1    Dec. 3, 2020

(30) Foreign Application Priority Data

Aug. 2, 2017 (JP) .............................. JP2017-150288

(51) Int. Cl.
*C09J 11/06* (2006.01)
*B32B 7/12* (2006.01)
(Continued)

(52) U.S. Cl.
CPC ................ *C09J 11/06* (2013.01); *B32B 7/12* (2013.01); *B32B 15/08* (2013.01); *B32B 37/12* (2013.01);
(Continued)

(58) Field of Classification Search
CPC .......... C09J 11/06; B32B 37/12; B32B 15/08; B32B 7/12; B32B 38/162; B32B 2307/538
See application file for complete search history.

(56) References Cited

U.S. PATENT DOCUMENTS 9,790,242 B2 * 10/2017 Mori ................... C07F 7/1804
10,385,076 B2 * 8/2019 Mori ..................... A61K 31/53
(Continued)

FOREIGN PATENT DOCUMENTS

JP       05-039295 A    2/1993
JP       2004-025835 A  1/2004
(Continued)

OTHER PUBLICATIONS

International Preliminary Report on Patentability and translation dated Aug. 9, 2018 in corresponding application No. PCT/JP2017/000855.
(Continued)

*Primary Examiner* — Nathan L Van Sell
(74) *Attorney, Agent, or Firm* — Foley & Lardner LLP

(57) ABSTRACT

A metal article characterized by including a metal substrate, a resin substrate, and a compound layer for bonding the metal substrate and resin substrate; the compound layer being a first compound layer including a first compound having a nitrogen-containing functional group and a silanol group, and a second compound which is an alkane-type amine-based silane coupling agent, and the first compound not containing sulfur atoms.

25 Claims, 16 Drawing Sheets

(51) Int. Cl.
  *B32B 38/16* (2006.01)
  *B32B 37/12* (2006.01)
  *B32B 15/08* (2006.01)
(52) U.S. Cl.
  CPC ...... *B32B 38/162* (2013.01); *B32B 2307/538* (2013.01)

(56) References Cited

U.S. PATENT DOCUMENTS

| | | |
|---|---|---|
| 2002/0132056 A1 | 9/2002 | Montano et al. |
| 2005/0121229 A1 | 6/2005 | Takai et al. |
| 2005/0214553 A1 | 9/2005 | Yannetti et al. |
| 2007/0207337 A1 | 9/2007 | Nagatani |
| 2008/0011612 A1 | 1/2008 | Takai et al. |
| 2008/0214744 A1 | 9/2008 | Tsuchida et al. |
| 2008/0277143 A1 | 11/2008 | Takai et al. |
| 2009/0032287 A1 | 2/2009 | Takai et al. |
| 2010/0065315 A1 | 3/2010 | Kimura |
| 2011/0003989 A1 | 1/2011 | Tsuchida |
| 2011/0088933 A1 | 4/2011 | Amou et al. |
| 2011/0189432 A1 | 8/2011 | Goto et al. |
| 2011/0217512 A1 | 9/2011 | Heishi et al. |
| 2013/0183534 A1 | 7/2013 | Mori et al. |
| 2014/0227539 A1 | 8/2014 | Mori et al. |
| 2015/0152124 A1 | 6/2015 | Mori et al. |
| 2016/0125971 A1 | 5/2016 | Hasebe et al. |
| 2016/0152641 A1* | 6/2016 | Mori .................. C08K 5/3492 544/196 |
| 2017/0334933 A1 | 11/2017 | Mori et al. |

FOREIGN PATENT DOCUMENTS

| | | |
|---|---|---|
| JP | 2005-262506 A | 9/2005 |
| JP | 2006-213677 A | 8/2006 |
| JP | 2007-262126 A | 10/2007 |
| JP | 2007-290003 A | 11/2007 |
| JP | 2008-031448 A | 2/2008 |
| JP | 2008-077930 A | 4/2008 |
| JP | 2008-174604 A | 7/2008 |
| JP | 2010-042564 A | 2/2010 |
| JP | 2010-131952 A | 6/2010 |
| JP | 2010-149389 A | 7/2010 |
| JP | 2010-280813 A | 12/2010 |
| JP | 2011-012002 A | 1/2011 |
| JP | 2011-091066 A | 5/2011 |
| JP | 2011-108848 A | 6/2011 |
| JP | 2012-035631 A | 2/2012 |
| JP | 2014-025095 A | 2/2014 |
| JP | 2014-025099 A | 2/2014 |
| JP | 2014-027042 A | 2/2014 |
| JP | 2014-027053 A | 2/2014 |
| JP | 2015-116751 A | 6/2015 |
| JP | 6268370 B2 | 1/2018 |
| WO | WO-2012/046651 A1 | 4/2012 |
| WO | WO-2013/186941 A1 | 12/2013 |
| WO | WO-2014/196501 A1 | 12/2014 |

OTHER PUBLICATIONS

International Preliminary Report on Patentability issued in International Application No. PCT/JP2018/018588 dated Feb. 13, 2020.
International Search Report and Written Opinion dated Aug. 7, 2018 in corresponding application No. PCT/JP2018/018588.
International Search Report and Written Opinion issued in International Application No. PCT/JP2017/000855 dated Feb. 28, 2017.
Japanese Office Action dated Jul. 31, 2018 in corresponding application No. 2017-150288.
Japanese Patent Office, "Decision to Grant Patent," issued in connection with Japanese Patent Application No. 2017-506437, dated Nov. 14, 2017.
Japanese Patent Office, "Notification of Reasons for Refusal," issued in connection with Japanese Patent Application No. 2017-506437, dated Aug. 22, 2017.
Non-Final Office Action on U.S. Appl. No. 16/072,597 dated Mar. 11, 2020.
Restriction Requirement on U.S. Appl. No. 16/072,597 dated Nov. 19, 2019.
Non-Final Office Action on U.S. Appl. No. 16/072,597 dated Jun. 25, 2020.
Final Office Action dated Dec. 2, 2020 for corresponding U.S. Appl. No. 16/072,597.

* cited by examiner

COMPOSITE OF METAL AND RESIN

CROSS-REFERENCE TO RELATED APPLICATIONS

The present application claims priority under 37 U.S.C. § 371 to International Patent Application No. PCT/JP2018/018588, filed May 14, 2018, which claims priority to and the benefit of Japanese Patent Application No. 2017-150288, filed on Aug. 2, 2017. The contents of these applications are hereby incorporated by reference in their entireties.

TECHNICAL FIELD

The present invention relates to a metal article including a metal member having a resin member bonded to at least a part of a surface of the metal member, a resin member appropriate for manufacture of a metal article, and a method of manufacturing the same.

BACKGROUND ART

There is an increasing demand for higher performance in a laminate used in a flexible printed circuit board or a printed circuit board used in an electronic device. As a circuit becomes finer, it is necessary to aim at a thickness reduction of a conductor forming a wiring board and smoothing of the surface thereof. In addition, in a high-frequency signal circuit, there is a phenomenon called "skin effect" in which current flows near a circuit surface and a roughness of a conductor surface causes an increase in a transmission loss, and that is also the reason why smoothing of an interface between a conductor and an insulating material is required.

In electronic device components and members also, film thinning and sheet thinning of a metal foil and a metal plate as a conductor are required, while a laminate which can withstand severe processing conditions such as bending and pressing is required, and it is a problem to improve a boiding strength between a metal foil or a metal plate and a resin member.

In a flexible printed circuit board, a base material in which a conductive layer is formed by copper plating on a polyimide resin film having a high heat resistance and a base material to which a copper foil is adhered are widely used. In the manufacture of a flexible printed circuit board base material, when forming a conductor layer having a sufficient thickness on a polyimide film by electrolytic copper plating, it is common practice to apply a silane coupling agent for improving adhesion in formation of a barrier layer containing Ni as a main component, copper sputtering, or electroless copper plating layer or catalyst application. Patent Document 1 (JP 2010-42564 A) discloses a method in which a silane coupling agent is applied to a vacuum-dried polyimide film, a barrier layer containing Ni as a main component is formed by sputtering, and then a copper conductor layer is formed by sputtering and plating. In Patent Document 2 (JP 2007-290003 A), it is described that a silane coupling agent is applied to a self-support body of a polyimide resin (a semi-cured state before a curing step) and then heated to complete imidization, and simultaneously, the coupling agent forms an inorganic oxide layer to modify a film surface, thereby improving the application of a catalyst and the adhesion of a plating layer. However, the adhesion of these plated conductor layers is at a level to withstand tape peeling, which is still insufficient. Patent Document 3 (JP 2008-31448 A) discloses that a polyimide film having a specific chemical structure is plasma-treated, and a silane coupling agent having a functional group such as an amino group or a mercapto group is applied to a metal foil and hot-pressed, thereby obtaining a high adhesive strength, but there is a limitation on applicable polyimide films.

The silane coupling agent is also applied to a laminate of a printed circuit board. In Patent Document 4 (JP 2004-25835 A), it is described that it is possible to obtain excellent adhesion by treating a metal foil with a silane coupling agent which chemically reacts with a functional group in an insulating resin composition. Examples of the silane coupling agent treating a metal foil include a silane coupling agent having an amino group which chemically reacts with an epoxy group in an insulating resin composition. However, since a surface roughness of the applied metal foil is defined as Rz of 2.0 μm or less, it is considered that the technique of this application also has contribution to an anchor effect.

On the other hand, a functional group of a silane coupling agent which is optimally chemically adsorbed to a metal foil has not been studied.

In daily necessities such as foods, cosmetics, and pharmaceuticals, and in packaging materials such as lithium ion batteries, a laminate of a metal foil and a resin film is used to enhance barrier properties. Patent Document 5 (JP 2010-149389 A) discloses that in forming a permeation-resistant adhesive layer provided for preventing a lamination strength between the respective layers from being reduced, which can secure an initial excellent laminating property even when a highly permeable content acts, a metal alkoxide is added to a compound having an isocyanate group. Here, a silane coupling agent is exemplified as one of the metal alkoxides. It is described that since in a permeation-resistant adhesive layer laminated on the vapor-deposited thin film layer of a resin film on which an inorganic oxide layer is vapor-deposited, a compound having an isocyanate group and a metal alkoxide undergo a three-dimensional cross-linking reaction to form a network until there is no reactive functional group, an inorganic oxide layer on a resin film and a sealant layer made of an olefin-based resin are firmly adhered. In Patent Document 6 (JP 2008-77930 A), it is described that in a packaging material for a lithium battery, when a coating layer is provided on an aluminum foil, interlayer separation between an aluminum foil and a heat-fusible film layer caused by a high permeation force of an electrolyte into a solvent is prevented, and deterioration of aluminum by hydrofluoric acid produced by hydrolysis of a lithium salt constituting the electrolytic solution is prevented. A use of a silane coupling agent as an additive of rare-earth element-based oxide sol constituting the coating layer or a crosslinking agent of a cationic polymer is exemplified. Rare-earth element-based oxide sol acts on an aluminum foil to improve adhesion, and a nitrogen atom of an amine ligand of a cationic polymer and rare-earth element-based oxide sol form a complex to improve adhesion.

Since a copper alloy has excellent electrical conductivity and thermal conductivity, it is widely used in electric and electronic components as rolled materials, expansile materials, foil materials, and plating materials. A copper alloy is an indispensable material as a wiring material, and an electronic circuit board (printed circuit board) in which copper wiring and an insulating layer mainly composed of a resin are composited is used for an electronic device. A printed circuit board includes a rigid printed circuit board using an inflexible material in an insulating layer, like a resin material such as an epoxy resin impregnated in a glass fiber and cured, and a flexible printed circuit board (hereinafter, referred to as FPC) using a resin material which is thin and has flexibility, such as a polyimide film and a polyester film, as an insulating layer.

In any printed board, it is necessary to increase a bonding force between a resin material and copper wiring, and various techniques have been proposed. For example, as a base material used in FPC, a flexible copper clad laminate (FCCL) in which a copper foil is adhered/bonded to one or both surfaces of a resin film is known, and in order to improve an adhesive/bonding strength between the resin film and the copper foil, a method of roughening a surface of the copper foil and closely adhering an adhesive or a heated resin surface to the unevenness of the roughened surface (anchor effect) is used.

However, in the case of a high-frequency signal, the signal flows through the surface layer of wiring by an effect called a skin effect, and thus, if there is unevenness on the surface of the copper foil, a transmission distance is increased and a transmission loss is increased. Therefore, in order to achieve a low transmission loss in the transmission loss which is an important characteristic of FPC, it is required that smoothness of the surface of the copper foil is high. Therefore, there is a demand for a method capable of bonding a copper foil having a smooth surface and a resin material with a high strength.

Patent Document 7 (JP 2011-91066 A) discloses a circuit board (multilayer wiring board) in which, in a circuit board having a resin cured product as an insulating layer, particularly, in order to obtain a high adhesive property between a copper wiring layer having a smooth surface and an insulating layer, a copper oxide layer present on the surface of the copper wiring layer is substituted or coated with an oxide and/or hydroxide of other metals such as tin, zinc, chromium, cobalt, and aluminum, an amine-based silane coupling agent having a silanol group covalently bonded to the oxide and hydroxide layers or a mixture layer thereof is provided, and furthermore, a vinyl-based silane coupling agent layer having a carbon-carbon unsaturated double bond is formed thereon, thereby forming a covalent bond between vinyl groups contained in the resin cured product of the insulating layer.

As a method of manufacturing a circuit board, it is disclosed that a copper oxide layer on a copper surface is replaced or coated with a metal oxide and/or hydroxide layer such as tin, zinc, chromium, cobalt, and aluminum by plating, sputtering, or vapor deposition, the metal oxide and hydroxide layers enhance an adhesive strength between the silane coupling agent and the metal layer, a residual silanol group in an amine-based silane coupling agent layer and a silanol group in a vinyl-based silane coupling agent layer forms a covalent bond, and furthermore, a carbon-carbon unsaturated double bond of a vinyl-based silane coupling agent forms a covalent bond with a vinyl compound in the insulating layer, and a resin cured product of the insulating layer is pressed and cured under heating.

This circuit board has a complicated configuration and the manufacturing process thereof is complicated.

Patent Document 8 (JP 2010-131952 A) discloses a flexible laminated board in which a silane coupling agent is interposed between a base film of polyethylene naphthalate (PEN) which is a polyester-based resin and a conductive film such as copper. It is described that a hydrolysis functional group of the silane coupling agent reacts with water to form a silanol group and is bonded to a metal such as copper, and an organic functional group is bonded to PEN by a reaction. Also disclosed is a lamination step in which laminating a copper alloy is laminated on a base film coated with a silane coupling agent by a sputtering method, and further, a conductive layer is formed by copper plating.

Patent Document 9 (JP 2014-27042 A), Patent Document 10 (JP 2014-27053 A), Patent Document 11 (JP 2014-25095 A), and Patent Document 12 (JP 2014-25099 A) disclose a copper or aluminum metal material of which the surface is not roughened, or a surface-treated metal material obtained by subjecting the metal material plated with silver, nickel or chromate to a surface treatment with a silane or titanium coupling agent. Furthermore, there is disclosed a method of manufacturing a composite in which a liquid crystal polymer (hereinafter, referred to as LCP) film having a polyester structure is thermally compressed or the polymer is injection-molded and bonded, to the surface-treated metal material. It is described that as a coupling agent for a surface treatment of a metal or its plating material, a coupling agent having a nitrogen-containing functional group, that is, an amine-based silane or a titanium coupling agent is preferred, and is adhered to a metal well, has a high peel strength (peeling strength), and is effective.

Patent Document 13 (WO 2013/186941) discloses a surface treatment agent including a novel amino group- and alkoxysilane group-containing triazine derivative compound. It is disclosed that the surface treatment agent including the novel compound is applied to various metal materials and polymer materials and hot-pressed, thereby bonding these materials to each other. Further, it is described that when another reagent is applied after the surface treatment with the novel compound, a reaction between a functional group present in the film of the novel compound and the other reagent occurs, so as to be converted into a material having more various functions.

CITATION LIST

Patent Document

Patent Document 1: JP 2010-42564 A
Patent Document 2: JP 2007-290003 A
Patent Document 3: JP 2008-31448 A
Patent Document 4: JP 2004-25835 A
Patent Document 5: JP 2010-149389 A
Patent Document 6: JP 2008-77930 A
Patent Document 7: JP 2011-91066 A
Patent Document 8: JP 2010-131952 A
Patent Document 9: JP 2014-27042 A
Patent Document 10: JP 2014-27053 A
Patent Document 11: JP 2014-25095 A
Patent Document 12: JP 2014-25099 A
Patent Document 13: WO 2013/186941 A

SUMMARY OF THE INVENTION

Technical Problems

In the case in which the insulating material forming a printed circuit board is a resin, conventionally, a sufficient bonding strength between a resin and metal wiring has not been obtained.

For example, when a polyester-based resin film, for example, a liquid crystal polymer (LCP) is used as an insulating material forming a printed circuit board, there is an advantage that a transmission loss of a high-frequency signal line can be reduced. However, when a polyester-based resin material and copper wiring are bonded with a silane coupling agent as disclosed in Patent Documents 7 to 12, the reaction of the coupling agent may not proceed as expected, mainly due to the chemical structure of the polyester-based resin. Therefore, an error in the bonding strength between the polyester-based resin material and the copper wiring is large (that is, reproducibility of the bonding strength is low), and the bonding strength may be low.

Since the novel compound disclosed in Patent Document 13 (WO 2013/186941) has an amino group and an alkoxysilane group introduced into a triazine ring, when a surface treatment agent containing the compound is used, a chemical bonding property between the metal and the resin is higher than that of the existing silane coupling agent. However, there is a need for a method capable of achieving a higher bonding strength.

Therefore, an object of the present invention is to provide a metal article in which a resin substrate and a metal substrate are bonded together with a sufficiently high bonding strength and a method of manufacturing the same.

Solution to Problems

The present inventors have conducted intensive studies to solve the above problems, and as a result, have found a solution having the following configuration, thereby completing the present invention.

Aspect 1 of the present invention provides a metal article including:
a metal substrate;
a resin substrate; and
a compound layer bonding the metal substrate and the resin substrate; wherein
the compound layer is a first compound layer including:
a first compound having a nitrogen-containing functional group and a silanol group; and
a second compound which is an alkane-type amine-based silane coupling agent, and
the first compound contains no sulfur atom.

Aspect 2 of the present invention provides the metal article according to Aspect 1, further including:
a second compound layer including a third compound which is a silane compound having two or more of alkoxysilyl or silanol groups.

Aspect 3 of the present invention provides the metal article according to Aspect 1 or 2, in which
the metal for the metal substrate is at least one selected from the group consisting of copper, aluminum, iron, stainless steel, nickel, zinc, and alloys thereof.

Aspect 4 of the present invention provides the metal article according to any one of Aspects 1 to 3, in which
a resin for the resin substrate is a thermoplastic resin or a thermosetting resin,
the thermoplastic resin is at least one selected from the group consisting of a polyester resin, a polyimide resin, a polyamide resin, an ABS resin, a polycarbonate resin, a polyolefin resin, a polystyrene resin, a vinyl chloride resin, an acryl resin, and a compounded or blended substance containing these resins and another polymer, and
the thermosetting resin is at least one selected from the group consisting of an epoxy resin, a phenol resin, a cyanate resin, a maleimide resin, an isocyanate resin, a benzocyclobutene resin, and a compounded or blended substance containing these resins and another polymer.

Aspect 5 of the present invention provides the metal article according to any one of Aspects 1 to 4, in which
the first compound is represented by the following formula:

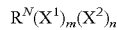

where $R^N$ is a 5-membered or 6-membered nitrogen heterocycle,
each $X^1$ is identical or different, and $X^1$ is a monovalent organic group having a silanol group or an alkoxysilyl group,
each $X^2$ is identical or different, and $X^2$ is a hydrogen atom or a monovalent organic group having no silicon atom, and
m is a number from 1 to 3, n is a number from 1 to 3, and a sum of m and n is the number of carbon atoms in the nitrogen heterocycle.

Aspect 6 of the present invention provides the metal article according to Aspect 5, in which
in the first compound,
each $X^1$ is identical or different, and $X^1$ a group represented by the following Structure (A):

where Y is a divalent hydrocarbon group which is optionally interrupted by a heteroatom selected from the group consisting of an oxygen atom and a nitrogen atom or by a carbonyl carbon and which optionally has a substituent,
$R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3; and
each $X^2$ is identical or different, and $X^2$ a hydrogen atom or a hydrocarbon group.

Aspect 7 of the present invention provides the metal article according to any one of Aspects 1 to 6, in which
the second compound is a compound represented by the following formula:

where $R^{11}$ is a monovalent organic group having an amino group, and
$X^{11}$ is a monovalent organic group having a silanol group or an alkoxysilyl group.

Aspect 8 of the present invention provides the metal article according to Aspect 7, in which
in the second compound,
$R^{11}$ is a hydrocarbon group having an amino group,
$X^{11}$ is a group represented by the following Structure (B):

where $R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3.

Aspect 9 of the present invention provides the metal article according to Aspect 7 or 8, in which
the second compound is at least one selected from the group consisting of N-2-(aminoethyl)-3-aminopropylmethyldimethoxysilane, N-2-(aminoethyl)-3-aminopropyltrimethoxysilane, 3-aminopropyltrimethoxysilane, and 3-aminopropyltriethoxysilane.

Aspect 10 of the present invention provides the metal article according to any one of Aspects 1 to 9, in which the third compound is at least one selected from the group consisting of polymer type polyfunctional group silane coupling agents, melamine functional organosilicon compounds, and isocyanurate functional silicon compounds.

Aspect 11 of the present invention provides the metal article according to Aspect 10, in which in the third compound, the polymer type polyfunctional group silane coupling agent is a compound having a repeating unit represented by the following formula:

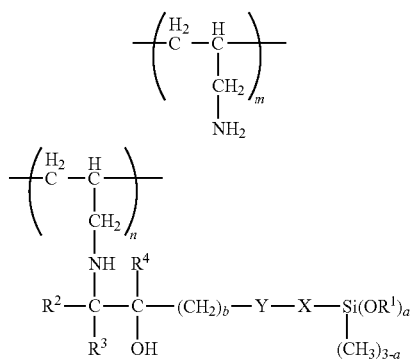

where m is $10 \leq m \leq 260$ and n is $1 \leq n \leq 100$, $R^1$ is a hydrogen atom, an alkyl group having 1 to 4 carbon atoms, or an acetyl group, a and b are integers of 1 to 3, X is an alkylene chain having 1 to 10 carbon atoms which optionally has a substituent, the substituent being an alkyl group having 1 to 6 carbon atoms, Y represents a direct bond, an oxygen atom, or a $CHR^5$ group, and $R^2$, $R^3$, $R^4$, and $R^5$ represent a hydrogen atom or an alkyl group having 1 to 6 carbon atoms, but $R^3$ or $R^4$ and $R^5$ are optionally bonded to form a saturated carbocycle;

the melamine functional organosilicon compound is a compound represented by the following formula:

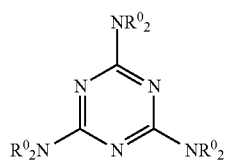

where $R^0$ is independently a hydrogen atom, or a monovalent hydrocarbon group which is optionally interrupted by a heteroatom selected from the group consisting of an oxygen atom, a sulfur atom, and a nitrogen atom or by a carbonyl carbon and which optionally has a substituent, and at least one of $R^0$ is a monovalent organic group having a silanol group or an alkoxysilyl group; and the isocyanurate functional silicon compound is a compound represented by the following formula:

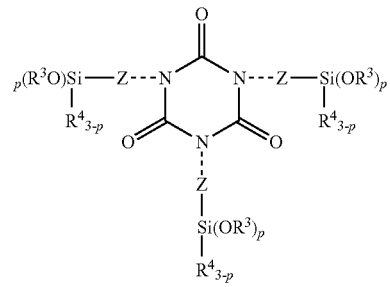

where Z is a divalent hydrocarbon group which is optionally interrupted by a heteroatom selected from the group consisting of an oxygen atom, a sulfur atom, and a nitrogen atom or by a carbonyl carbon and which optionally has a substituent, $R^3$ is a hydrogen atom or an unsubstituted or substituted alkyl group having 1 to 4 carbon atoms, $R^4$ is an unsubstituted or substituted alkyl group having 1 to 4 carbon atoms, and p is an integer of 1 to 3.

Aspect 12 of the present invention provides the metal article according to any one of Aspects 1 to 11, in which each of the second compound and the third compound is a compound containing no sulfur atom.

Aspect 13 of the present invention provides the metal article according to any one of Aspects 1 to 12, in which amounts of the first compound and the second compound are 1:0.2 to 1:50 as a molar ratio, or 1:0.2 to 0.1:8 as a weight ratio.

Aspect 14 of the present invention provides the metal article according to any one of Aspects 1 to 13, in which amounts of the first compound and the second compound are 1:16 to 0.1:45 as a % by weight ratio, and an amount of the third compound is 1 to 1000 parts by weight, with respect to 100 parts by weight in total of the first compound and the second compound.

Aspect 15 of the present invention provides the metal article according to any one of Aspects 1 to 14, in which a surface roughness Ra of the metal substrate is 0.1 μm or less.

Aspect 16 of the present invention provides the metal article according to any one of Aspects 1 to 15, in which an oxide layer and a rust inhibitor layer are not present on a surface of the metal substrate.

Aspect 17 of the present invention provides a method of manufacturing the metal article described in Aspect 1, in which a first compound layer including a first compound and a second compound is formed between a metal substrate and a resin substrate.

Aspect 18 of the present invention provides the method of manufacturing the metal article described in Aspect 2, in which a first compound layer including a first compound and a second compound and a second compound layer including a third compound are formed between a metal substrate and a resin substrate.

Aspect 19 of the present invention provides the method of manufacturing the metal article according to Aspect 17, including:

bringing a solution containing the first compound and the second compound into contact with a surface of the resin substrate and then performing heating to obtain a resin member having the first compound layer; and bonding the metal substrate and the resin member.

Aspect 20 of the present invention provides the method of manufacturing the metal article according to Aspect 18, including:

bringing a solution containing the first compound and the second compound into contact with a surface of the metal substrate and then performing heating to obtain a metal member having the first compound layer;

bringing a solution containing the third compound into contact with a surface of the resin substrate and then performing heating to obtain a resin member having the second compound layer; and bonding the metal member and the resin member.

Aspect 21 of the present invention provides the method of manufacturing the metal article according to Aspect 18, including:

obtaining a metal member having the first compound layer and the second compound layer in an overlapping manner, wherein the first compound layer is formed by bringing the solution containing the first compound and the second compound into contact with a surface of the metal substrate and then performing heating and the second compound layer is formed by bringing the solution containing the third compound into contact with the first compound layer and then performing heating; and bonding the metal member and the resin substrate.

Aspect 22 of the invention provides the method of manufacturing the metal article according to any one of Aspects 17 to 21, further including:

cleaning the metal substrate with an acid aqueous solution.

Aspect 23 of the present invention provides a metal member including a metal substrate and a first compound layer provided on a surface of the metal substrate, in which the compound layer includes:
a first compound having a nitrogen-containing functional group and a silanol group, and
a second compound which is an alkane-type amine-based silane coupling agent, and
the first compound contains no sulfur atom.

Aspect 24 of the present invention provides a metal member including a metal substrate and a compound layer provided on a surface of the metal substrate, in which the compound layer includes:
a first compound layer including: a first compound having a nitrogen-containing functional group and a silanol group; and a second compound which is an alkane-type amine-based silane coupling agent; and
a second compound layer including a third compound which is a silane compound having two or more of alkoxysilyl or silanol groups, and
the first compound contains no sulfur atom.

Aspect 25 of the invention provides a method of manufacturing the metal member described in Aspect 23, including:

cleaning a metal substrate with an acid aqueous solution; and bringing a solution containing a first compound and a second compound into contact with a surface of a metal substrate and then performing heating.

Aspect 26 of the present invention provides a method of manufacturing the metal member described in Aspect 24, including:

cleaning the substrate with an acid aqueous solution; and bringing a solution containing a first compound and a second compound into contact with a surface of the metal substrate and then performing heating to form a first compound layer, and bringing a solution containing a third compound which is a silane compound having two or more of alkoxysilyl or silanol groups into contact with a surface of the first compound layer and then performing heating to form a second compound layer in an overlapping manner.

Aspect 27 of the present invention provides a resin member including: a resin substrate and a first compound layer provided on a surface of the resin substrate, in which the compound layer includes:
a first compound having a nitrogen-containing functional group and a silanol group; and
a second compound which is an alkane-type amine-based silane coupling agent, and
the first compound contains no sulfur atom.

Aspect 28 of the invention provides a resin member including: a resin substrate and a second compound layer provided on a surface of the resin substrate, in which the compound layer includes a third compound which is a silane compound having two or more of alkoxysilyl or silanol groups.

Aspect 29 of the invention provides a method of manufacturing the resin member described in Aspect 27, including:

bringing a solution containing a first compound and a second compound into contact with a surface of a resin substrate and then performing heating.

Aspect 30 of the present invention provides a method of manufacturing the resin member described in Aspect 28, including:

bringing a solution containing a third compound into contact with a surface of a resin substrate and then performing heating.

Advantageous Effects of Invention

According to the aspects of the present invention, a resin substrate and a metal substrate can be bonded with a sufficient bonding strength, by interposing a compound layer including a first compound and a second compound and/or interposing a compound layer including a third compound therebetween.

DESCRIPTION OF EMBODIMENTS

Figure 1A:
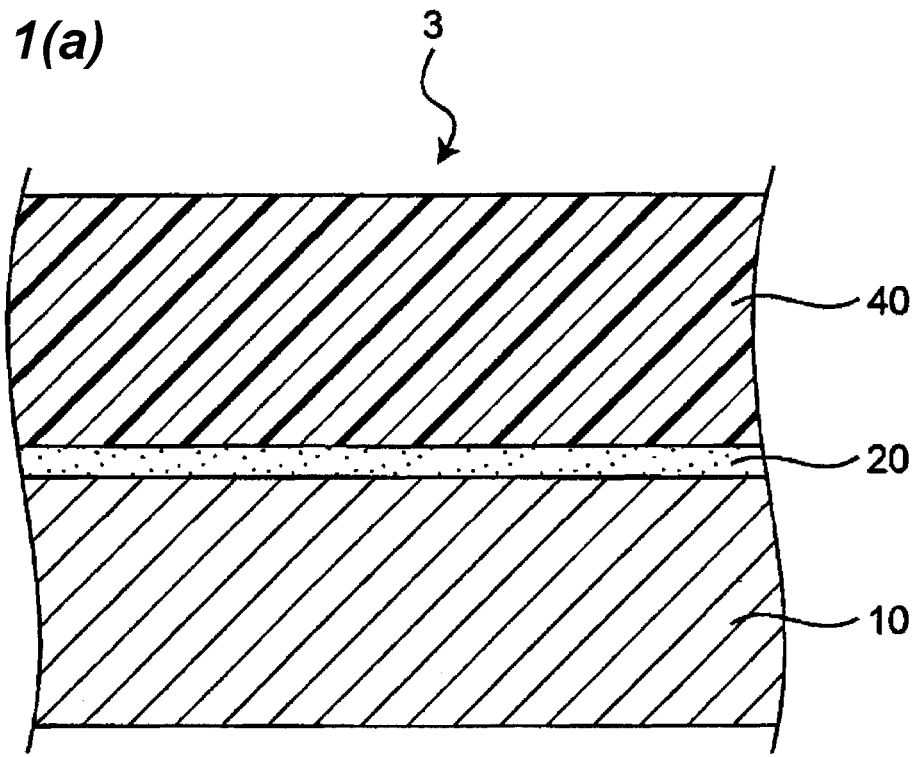
FIGS. 1(a) and 1(b) are schematic cross-sectional views of a copper alloy article according to an embodiment of the present invention.

The present inventors have found that when a compound layer for bonding a metal substrate and a resin substrate includes two types of compounds (a first compound and a second compound), a bonding strength can be increased as compared with the case of including only one type of compound, thereby completing the metal article according to the present disclosure.

Specifically, as the first compound, a compound having both a nitrogen-containing functional group and a silanol group is used. As the second compound, an alkane-type amine-based silane coupling agent is used. That is, the present disclosure relates to a copper alloy article in which a metal substrate and a resin substrate are bonded via a compound layer that includes: a first compound having a nitrogen-containing functional group and a silanol group; and a second compound which is an alkane-type amine-based silane coupling agent.

Further, the present inventors have found that by forming a second compound layer formed from a silane compound having two or more of alkoxysilyl groups or silanol groups in addition to the first compound layer formed from the first compound and the second compound, a bonding strength is further increased, and have reached the present invention.

When the article is applied to a substrate, a component, or the like used in an electronic device, it is preferred that each of the first compound, the second compound, and the third compound may be a compound containing no thiol group (or no sulfur atom).

[Metal Substrate]

As a metal used for the metal substrate, copper, aluminum, iron/stainless steel, nickel, zinc, and the like can be used. It is preferred that the metal is copper, a copper alloy, aluminum, or an aluminum alloy.

It is preferred that no oxide layer is present on the surface of the metal substrate.

The thickness of the metal is not particularly limited, but may be 1 μm to 100 mm. The thickness of the metal foil is preferably 300 μm or less.

[Resin Substrate]

A resin of the resin substrate is a thermoplastic resin or a thermosetting resin. Examples of the thermoplastic resin include a polyester resin, a polyamide resin, a polyimide resin, an ABS resin, a polycarbonate resin, a polyolefin resin (for example, polyethylene and polypropylene), a polystyrene resin, a vinyl chloride resin, an acryl resin, a compounded or blended substance containing these resins another polymer, and the like, but are not limited thereto. Examples of the thermosetting resin include, an epoxy resin, a phenol resin, a cyanate resin, a maleimide resin, an isocyanate resin, a benzocyclobutene resin, a vinyl resin, and the like, but are not limited thereto. It is preferred that the resin is a polyester resin, a polyimide resin, a polyamide resin, an epoxy resin, a phenol resin, and a compounded or a blended substance containing these resins and another polymer.

The resin substrate may be in any form or shape, such as a film material, a plate material, a bar material, a tube material, and a molding material. The thickness of the resin is not particularly limited, but may be, for example, 0.01 mm to 100 mm.

[Compound Layer]

The first compound layer is a mixture including the first compound and the second compound.

The second compound layer is composed of a third compound.

A mixing ratio of the first compound to the second compound may be 1:0.2 to 1:50, preferably 1:0.5 to 1:15, or 1:16 to 0.1:45 as a molar ratio. Alternatively, amounts of the first compound and the second compound may be 1:0.2 to 1:8 as a % by weight ratio. An amount of the third compound may be 1 to 1000 parts by weight, with respect to 100 parts by weight in total of the first compound and the second compound.

The first compound, the second compound, and the third compound are applied (coated) to a metal substrate or a resin substrate. A mixed solution of the first compound and the second compound forming the first compound layer may be applied to both or any one of the metal and resin substrates. For example, a mixed solution of the first compound and the second compound is applied to both or one of the metal substrate and the resin substrate. By performing a heat treatment after the application, the first compound layer is formed. The third compound forming the second compound layer can be applied to the first compound layer in an overlapping manner after the heat treatment or can be applied on a resin substrate. By performing a heat treatment after the application, the second compound layer is formed. The temperature of the heat treatment may be, for example, 80 to 250° C.

The thickness of the first and the second compound layers is not particularly limited, but may be 1 nm to 10 μm, preferably 10 nm to 1 μm.

[First Compound]

It is preferred that the first compound is a compound represented by the following formula:

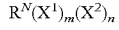

where $R^N$ is a 5-membered or 6-membered nitrogen heterocycle, each $X^1$ is identical or different, and $X^1$ is a monovalent organic group having a silanol group or an alkoxysilyl group, each $X^2$ is identical or different, and $X^2$ is a monovalent organic group having no silicon atom, and m is a number from 1 to 3, n is a number from 1 to 3, and a sum of m and n is the number of carbon atoms and/or nitrogen atoms in the nitrogen heterocycle.

$R^N$ is a nitrogen heterocycle having a ring nitrogen atom (a nitrogen atom constituting the ring). The nitrogen heterocycle is a 5- or 6-membered ring. In the nitrogen heterocycle, the number of ring nitrogen atoms is preferably 2 or 3. Specific examples of the nitrogen heterocycle which is the 5-membered ring include imidazole, pyrazole, imidazoline, benzimidazole, triazole, benzotriazole and the like. Specific examples of the nitrogen heterocycle which is the 6-membered ring include diazine-based pyrazine, pyrimidine, pyridazine, and further, benzodiazine, dibenzodiazine, triazine, and the like.

$X^1$ and $X^2$ are bonded to a carbon atom or a nitrogen atom of the heterocyclic $R^N$ having a nitrogen atom.

$X^1$ is a monovalent organic group having a silanol group or an alkoxysilyl group. At least one (preferably all) of $X^1$ has the following Structure (A).

(A)

where Y is a divalent hydrocarbon group which is optionally interrupted by a heteroatom selected from the group consisting of an oxygen atom, a sulfur atom, and a nitrogen atom or a carbonyl carbon, and optionally has a substituent, $R^3$ is a hydrogen atom or an unsubstituted or substituted alkyl group having 1 to 4 carbon atoms, $R^4$ is an unsubstituted or substituted alkyl group having 1 to 4 carbon atoms, and p is an integer of 1 to 3.

In the formula of Structure (A), a broken line represents a bonding hand.

In Structure (A), examples of the unsubstituted or substituted alkyl group having 1 to 4 carbon atoms of $R^3$ and $R^4$ include a methyl group, an ethyl group, a propyl group, an isopropyl group, an n-butyl group, an isobutyl group, a tert-butyl group, those groups in which a part or all of the hydrogen atoms thereof are substituted with a halogen atom and the like, for example, a chloroethyl group and a 3,3,3-trifluoropropyl group, and the like. A methyl group or an ethyl group is preferred.

In Structure (A), a carbon atom at one end of Y is bonded to a heterocycle R, and a carbon atom at the other end of Y is bonded to a silicon atom.

The divalent hydrocarbon group of Y in Structure (A) has preferably 1 to 10 carbon atoms, and examples thereof include a methylene group, an ethylene group, a propylene group, a 1-methyl-propylene group, a 2-methyl-propylene group, a 3-methyl-propylene group, a butylene group, and the like, but are not limited thereto.

p is an integer of 1 to 3, preferably 2 or 3, and particularly preferably 3.

The structure of Structure (A) is not particularly limited, but may be an organosilicon group containing both a primary amino group and/or a secondary amino group and a hydrolyzable silyl group, an organosilicon group containing a primary amino group and/or secondary amino group such as a silicon alkoxy oligomer having a primary and/or secondary amino group as described above, and the like, such as α-aminomethyltrimethoxysilane, α-aminomethylmethyldimethoxysilane, α-aminomethyldimethylmethoxysilane, α-aminomethyltriethoxysilane, α-aminomethylmethyldiethoxysilane, α-aminomethyldimethylethoxysilane, γ-aminopropyltrimethoxysilane, γ-aminopropylmethyldimethoxysilane, γ-aminopropyldimethylmethoxysilane, γ-aminopropyltriethoxysilane, γ-aminopropylmethyldiethoxysilane, γ-aminopropyldimethylethoxysilane, N-2(aminoethyl) α-aminomethyltrimethoxysilane, N-2(aminoethyl) α-aminomethylmethyldimethoxysilane, N-2(aminoethyl) α-aminomethyldimethylmethoxysilane, N-2(aminoethyl) α-aminomethyltriethoxysilane, N-2(aminoethyl) α-aminomethylmethyldiethoxysilane, N-2(aminoethyl) α-aminomethyldimethylethoxysilane, N-2(aminoethyl) γ-aminopropyltrimethoxysilane, N-2(aminoethyl) γ-aminopropylmethyldimethoxysilane, N-2(aminoethyl) γ-aminopropyldimethylmethoxysilane, N-2(aminoethyl) γ-aminopropyltriethoxysilane, N-2(aminoethyl) γ-aminopropylmethyldiethoxysilane, N-2(aminoethyl) γ-aminopropyldimethylethoxysilane, bis-(trimethoxysilylpropyl)amine, bis-(methyldimethoxysilylpropyl)amine, bis-(dimethylmethoxysilylpropyl)amine, bis-(triethoxysilylpropyl)amine, bis-(methyldiethoxysilylpropyl)amine, bis-(dimethylethoxysilylpropyl)amine, N-phenyl γ-aminopropyltrimethoxysilane, N-phenyl γ-aminopropylmethyldimethoxysilane, N-phenyl γ-aminopropyldimethylmethoxysilane, N-phenyl γ-aminopropyltriethoxysilane, N-phenyl γ-aminopropylmethyldiethoxysilane, N-phenyl γ-aminopropyldimethylethoxysilane, N-phenyl α-aminomethyltrimethoxysilane, N-phenyl α-aminomethylmethyldimethoxysilane, N-phenyl α-aminomethyldimethylmethoxysilane, N-phenyl α-aminomethyltriethoxysilane, N-phenyl α-aminomethylmethyldiethoxysilane, and N-phenyl α-aminomethyldimethylethoxysilane.

$X^2$ is a monovalent organic group which optionally has a substituent. $X^2$ is a hydrogen atom or a hydrocarbon group preferably having 1 to 10 carbon atoms, and examples of the substituent include an amino group, a vinyl group, an epoxy group, a styryl group, a methacryl group, an acrylic group, a ureido group, an isocyanate, a mercapto group, and the like. For example, $X^2$ may be a 2-(3,4-epoxycyclohexyl) ethyl group, a 3-glydoxypropylmethyl group, a 3-glydoxypropyl group, a p-styryl group, a 3-methacryloxypropylmethyl group, a 3-methacryloxypropyl group, a 3-acryloxypropyl group, an N-2-(aminoethyl)-3-aminopropylmethyl group, an N-2-(aminoethyl)-3-aminopropyl group, a 3-aminopropyl group, an N-(1,3-dimethyl)-butylidenepropylamino group, an N-phenyl-3-aminopropyl group, an N-(vinylbenzyl)-2-aminoethyl-3-aminopropyl group, a 3-ureidopropyl group, a 3-isocyanatepropyl group, or a 3-mercaptopropylmethyl group.

m is a number from 1 to 3. m is preferably a number from 1 to 2, and more preferably 1.

n is a number from 1 to 3.

[Second Compound]

The second compound is an alkane-type amine-based silane coupling agent. As the alkane-type amine-based silane coupling agent, a linear alkane-type amine-based silane coupling agent is preferred.

It is preferred that the second compound is a compound represented by the following formula:

$$R^{11}-X^{11}$$

where $R^{11}$ is a monovalent organic group which optionally has a substituent, and $X^{11}$ is a monovalent organic group having a silanol group or an alkoxysilyl group.

R¹¹ is preferably a hydrocarbon group having preferably 1 to 10 carbon atoms which may be substituted. Examples of the substituent include an amino group, a vinyl group, an epoxy group, a styryl group, a methacryl group, an acryl group, a ureide group, an isocyanate group, and a mercapto group. Specific examples of R¹¹ include a 2-(3,4-epoxycyclohexyl)ethyl group, a 3-glydoxypropylmethyl group, a 3-glydoxypropyl group, a p-styryl group, a 3-methacryloxypropylmethyl group, a 3-methacryloxypropyl group, a 3-acryloxypropyl group, an N-2-(aminoethyl)-3-aminopropylmethyl group, an N-2-(aminoethyl)-3-aminopropyl group, a 3-aminopropyl group, an N-(1,3-dimethyl)-butylidenepropylamino group, an N-phenyl-3-aminopropyl group, an N-(vinylbenzyl)-2-aminoethyl-3-aminopropyl group, a 3-ureidopropyl group, a 3-isocyanatepropyl group, and a 3-mercaptopropylmethyl group.

X¹¹ is preferably a group represented by the following Structure (B):

(B)

where

R³ is a hydrogen atom or an unsubstituted or substituted alkyl group having 1 to 4 carbon atoms, R⁴ is an unsubstituted or substituted alkyl group having 1 to 4 carbon atoms, and p is an integer of 1 to 3.

Details of Structure (B) are the same as those of the organosilicon group in Structure (A) of the first compound.

Specific examples of the second compound include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, and the like.

[Third Compound]

The third compound may be, for example, a polymer type polyfunctional group silane coupling agent, a melamine functional organosilicon compound, and an isocyanurate functional silicon compound.

The polymer type polyfunctional group silane coupling agent may be, for example, a compound described in JP 2008-174604 A. It is preferred that the polymer-type polyfunctional silane coupling agent has a plurality of amino groups, epoxy groups, acryl groups, methacryl groups, vinyl groups, phenyl groups, mercapto groups, isocyanate groups, and the like, in addition to a plurality of trialkoxysilyl groups, in a basic structure of a polyallylamino resin, considering chemical adsorbability to the metal surface. It is preferred that the polymer type polyfunctional group silane coupling agent is a compound having a repeating unit represented by the following formula:

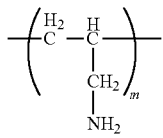

-continued

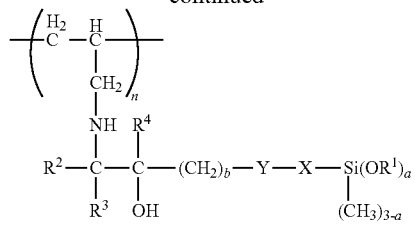

where m is 10≤m≤260 and n is 1≤n≤100, R¹ is a hydrogen atom, an alkyl group having 1 to 4 carbon atoms, or an acetyl group, a and b are an integer of 1 to 3, X is an alkylene chain having 1 to 10 carbon atoms which optionally has a substituent, the substituent being an alkyl group having 1 to 6 carbon atoms, Y is a direct bond, an oxygen atom or a CHR⁵ group, and R², R³, R⁴, and R⁵ represent a hydrogen atom or an alkyl group having 1 to 6 carbon atoms, but R³ or R⁴ and R⁵ are optionally bonded to form a saturated carbocyclic ring, and having a plurality of primary amino groups and a hydrolyzable silyl group and/or a silanol group.

The polymer type polyfunctional group silane coupling agent can be produced, for example, by reacting polyallylamine with a silicon compound having an epoxy group. Specific examples of the silicon compound having an epoxy group include glycidoxymethyltrimethoxysilane, glycidoxymethylmethyldimethoxysilane, glycidoxymethyldimethylmethoxysilane, glycidoxymethyltriethoxysilane, glycidoxymethylmethyldiethoxysilane, glycidoxymethyldimethylethoxysilane, 3-glycidoxy-2-methylpropyltrimethoxysilane, 3-glycidoxy-2-methylpropylmethyldimethoxysilane, 3-glycidoxy-2-methylpropyldimethylmethoxysilane, 3-glycidoxy-2-methylpropyltriethoxysilane, 3-glycidoxy-2-methylpropylmethyldiethoxysilane, 3-glycidoxy-2-methylpropyldimethylethoxysilane, and 2-(3,4-epoxycyclohexyl)ethyltrimethoxysilane.

A melamine functional organosilicon compound is an organosilicon compound having a melamine skeleton. The melamine functional organosilicon compound may be, for example, a compound described in JP 2011-12002 A. It is preferred that the melamine functional organosilicon compound is a compound represented by the following formula:

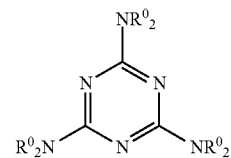

where R⁰ is independently a hydrogen atom or a monovalent hydrocarbon group which is optionally interrupted by a heteroatom selected from the group consisting of an oxygen atom, a sulfur atom, and a nitrogen atom or a carbonyl carbon and optionally has a substituent, and at least one of R⁰ is a monovalent organic group having a silanol group or an alkoxysilyl group.

R⁰ preferably has the following Structure (A):

(A)

where Y is a divalent hydrocarbon group which is optionally interrupted by a heteroatom selected from the group consisting of an oxygen atom, a sulfur atom, and a nitrogen atom or a carbonyl carbon, and optionally has a substituent,
$R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3.
Details of Structure (A) (for example, definition of Y and the like) are the same as those of the first compound.
Specific examples of melamine functional organosilicon compounds include N,N,N-tris-(trimethoxysilylpropyl)melamine, N,N,N-tris-(triethoxysilylpropyl)melamine, N,N-bis-(trimethoxysilylpropyl)-N-phenylmelamine, N,N-bis-(trimethoxysilylpropyl)-N-phenylmelamine, N,N-bis-(trimethoxysilylpropyl)-N-polydimethylsiloxypropyl)melamine, and the like.
It is preferred that the isocyanurate functional silicon compound is an organosilicon compound having a melamine skeleton represented by the following Formula (C):

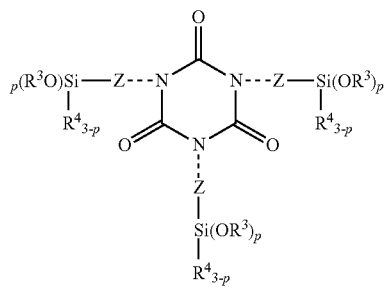

Formula (C)
where Z is a divalent hydrocarbon group which is optionally interrupted by a heteroatom selected from the group consisting of an oxygen atom, a sulfur atom, and a nitrogen atom or a carbonyl carbon, and optionally has a substituent,
$R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3.
Specific examples of the isocyanurate functional silicon compound include tris-(trimethoxysilylpropyl) isocyanurate, tris-(triethoxysilylpropyl) isocyanurate, and the like.
Hereinafter, the embodiments according to the present invention will be described.
In the following embodiment, an example in which the metal is a copper alloy and the resin is a polyester-based resin will be described. In the present invention, metals other than the copper alloy and resins other than the polyester-based resin can be used.

Embodiment 1

FIG. 1(a) is a schematic cross-sectional view of a copper alloy article 3 according to Embodiment 1. The copper alloy article 3 includes a copper alloy substrate 10, a polyester-based resin substrate 40, and a compound layer 20 disposed therebetween. The copper alloy substrate 10 and the polyester-based resin substrate 40 are bonded via the compound layer 20.

Figure 1B:
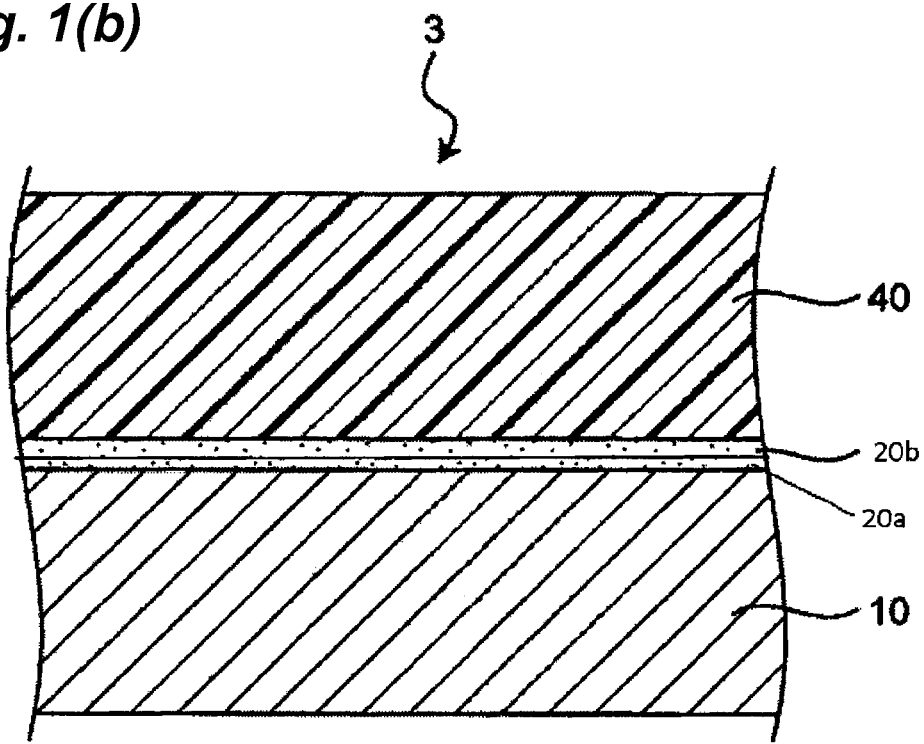

FIG. 1(b) is a schematic cross-sectional view of the copper alloy article 3 in which two compound layers exist between the copper alloy substrate 10 and the polyester-based resin substrate 40. The compound layer includes a first compound layer 20a and a second compound layer 20b.

The copper alloy substrate 10 is made of pure copper or various copper alloys, and any copper alloy which is industrially used can be used as the copper alloy.

As the copper alloy substrate 10, for example, a copper foil such as an electrolytic copper foil or a rolled copper foil can be applied. In particular, a rolled copper foil having high flexibility is suitable for FPC.

The polyester-based resin substrate 40 is made of a polyester-based resin. The polyester-based resin is, for example, a polycondensate of a polyvalent carboxylic acid (dicarboxylic acid) and a polyalcohol (diol). Polyethylene terephthalate (PET), polymethylene terephthalate, polybutylene-terephthalate, polyethylene naphthalate, polybutylene naphthalate, and a liquid crystal polymer (LCP) are preferred.

As the polyester-based resin substrate 40, for example, a polyester-based resin film, a polyester-based resin plate, or the like can be used. In particular, since an LCP film has a material characteristic of a low dielectric constant and a low dielectric loss tangent, when applied to FPC, there is an advantage that particularly a transmission loss of a high-frequency signal line is reduced. Further, the LCP film has a very low water absorption, and thus has good dimensional stability even under high humidity.

As an example, a copper alloy article using a rolled copper foil as the copper alloy substrate 10 and an LCP film as the polyester-based resin substrate will be described in detail. It should be noted that the copper alloy article 3 using the copper alloy substrate 10 and the polyester-based resin substrate 40 of other forms can be also similarly configured and manufactured.

(1) Selection of Rolled Copper Foil

In order to reduce the transmission loss of the high-frequency signal on a printed board, the surface of the copper alloy substrate 10 is preferably flat, and for example, the surface roughness Ra is preferably 0.1 μm or less. The surface roughnesses Ra and $R_z$ can be measured by a contact surface roughness meter, a laser microscope, or the like. In Embodiment 2 described later, it is preferred that the copper alloy is exposed to the surface of the copper alloy substrate 10. Therefore, a method of selecting a copper alloy substrate 10 suitable for any of the embodiments will be examined.

First, three types of commercially available copper foils (copper foils A to C) were selected for a copper foil having a thickness of 18 μm, which is the most demanded in FPC, and the surface layer was measured by X-ray photoelectron spectroscopy (XPS).

TABLE 1

| Copper foil | Surface layer XPS analysis | Surface roughness (μm) $R_a$ | Surface roughness (μm) $R_z$ | Remarks |
|---|---|---|---|---|
| A | Zinc plating | — | 0.75 | Used with existing FCCL |
| B | Oxide, rust inhibitor | 0.05 | 0.4 | There are a few oil spots |
| C | Oxide, rust inhibitor | 0.15 | — | There are many oil spots |

Copper foil A was used for existing FPC, but zinc was detected from XPS measurement. That is, it was found that the copper foil A was zinc-plated. As a copper foil suitable for Embodiment 2, a copper foil without a plating layer is preferred, and thus the copper foil A was excluded.

Though there was no plating layer on the surfaces of copper foils B and C, elements (for example, carbon and the like) derived from the oxidation of copper and the rust inhibitor applied to the surface of the copper foil were detected.

Next, with respect to these copper foils B and C, the surface roughness was measured and the surface was analyzed by an electron microscope (SEM).

The surface roughness Ra was measured with a laser microscope. The copper foil B had $R_a$ of 0.05 μm, and the copper foil C had $R_a$ of 0.15 μm.

When a wrinkle-like dent (oil spot) on the surface was confirmed by SEM observation, the copper foil B had fewer oil spots than the copper foil C.

From these results, it was determined that the copper foil B had higher surface smoothness, and thus the copper foil B was used for the copper alloy substrate 10.

(2) Cleaning of Copper Foil (Copper Alloy Substrate 10)

A commercially available copper foil is coated with a rust inhibitor. Further, an oxide layer can be produced on the surface of the copper foil over time. In the case of copper alloy articles such as FPC, in order to maximize the properties of the copper foil, for example, electrical conductivity, it is desirable to remove the rust inhibitor and the oxide layer from the surface of the copper foil and to expose the copper to the surface of the copper foil. To this end, it is necessary to perform cleaning (acid cleaning) for removing the rust inhibitor and oxide layers before using the copper foil. Therefore, the conditions of the acid cleaning were examined, using the copper foil B as a sample.

As a cleaning solution, 15% sulfuric acid and 1% hydrochloric acid at room temperature were used. After the sample was immersed in the cleaning solution for 0 minute (no cleaning), 1 minute, and 5 minutes, the sample was taken out of the cleaning solution, sufficiently cleaned with ion-exchanged water, and dried. Thereafter, the surface of the sample was subjected to XPS analysis to determine a cleaning level.

The cleaning level of the surface of the copper foil after acid cleaning was determined by whether or not a rust inhibitor remained on the surface. Specifically, the surface of the copper foil after cleaning was measured by XPS, and qualitatively determined by the presence or absence of a nitrogen (N) peak (peak of a nitrogen N is orbital near a binding energy of 400 eV) derived from the rust inhibitor. When a peak attributable to nitrogen (N) was confirmed in the XPS spectrum, it was determined as "present", and when no peak was confirmed, it was determined as "absent". Table 2 shows the measurement results.

The oxide layer may be also used as a criterion for determining the cleaning level. However, even in the case in which the oxide layer could be completely removed from the surface of the copper foil by acid cleaning, at the moment when the copper foil was taken out of the cleaning solution, the copper on the surface of the copper foil reacted with oxygen in the atmosphere and a trace amount of oxide was produced. In the surface analysis by XPS, since even such a trace amount of oxide is detected, it is difficult to accurately determine the cleaning level.

TABLE 2

| Cleaning solution | Immersion time | | |
|---|---|---|---|
| | 0 minute | 1 minute | 5 minutes |
| 15% sulfuric acid | Present | Absent | Absent |
| 1% hydrochloric acid | Present | Absent | Absent |

As shown in Table 2, in any of the cleaning solutions (acid aqueous solution), the peak derived from the nitrogen N is orbital disappeared from the surface of the copper foil in the immersion time of 1 minute, and the peak of a Cu 2p orbital derived from the oxide became minute. Therefore, it was determined that immersion in the cleaning solution for 1 minute can remove the rust inhibitor and oxides adhering to the copper foil. In the following embodiments, a copper foil cleaned with 1% hydrochloric acid which is easy to handle, for 1 minute, is used.

In addition, even in the copper alloy article using the copper foil, by subjecting the surface of the copper foil separated from the copper alloy article to XPS analysis, the peak derived from the N is orbital and the peak derived from the Cu 2p orbital were confirmed, from which it can be seen that the acid-cleaned copper foil was used. The absence of the rust inhibitor can be confirmed by the absence of the peak derived from the N 1s orbital. Further, since the peak derived from the Cu 2p orbital is very small (for example, the peak intensity of 1/10 or less, especially the peak intensity of 1/20 or less with respect to the peak intensity of the peak derived from Cu—O present in the vicinity of 935 eV), the absence of the oxide layer can be confirmed. As described above, even in the case in which the copper foil is acid-cleaned to remove the oxide layer, the copper foil is then taken out to the atmosphere to form a small amount of oxide. However, since such a very small amount of oxides do not have substantial influence on the characteristics of the copper foil (particularly, the bonding strength with the polyester-based resin substrate), it can be considered that there is substantially no oxide layer.

(3) Compound Layer

A compound layer 20 includes two types of compounds, a first compound having a nitrogen-containing functional group and a silanol group, and a second compound which is an alkane-type amine-based silane coupling agent. Any of them can be used alone as a silane coupling agent, but in the embodiment of the present invention, it has been found that a bulky first compound and a linear second compound are used in combination, thereby increasing the bonding strength as compared with the case in which the compounds are used alone.

Since the nitrogen-containing functional group has high chemical adsorbability to copper, it is effective in increasing the bonding strength to the copper alloy substrate 10. Since the silanol group has high chemical adsorbability to the ester structure of the polyester-based resin, it is effective in increasing the bonding strength to the polyester-based resin substrate 40. Therefore, a compound having a nitrogen-containing functional group and a silanol group (first compound) is suitable for bonding the copper alloy substrate 10 and the polyester-based resin substrate 40.

The present inventors first discovered that by coexistence of a linear silane coupling agent (second compound) with to the first compound as described above, the bonding strength between the copper alloy substrate 10 and the polyester-based resin substrate 40 can be increased. The reason why such an effect is obtained is not clear, but it is considered to be due to the following mechanism.

The second compound which is an alkane-type amine-based silane coupling agent, has a relatively low bulk structure (for example, a linear structure). Generally, the first compound having a nitrogen-containing functional group and a silanol group has a bulky structure as compared with a linear second compound. Therefore, in a situation in which only the first compound is present, the first compounds are unlikely to approach each other. Since the second compound can enter between the bulky first compounds, the density of the compound in the compound layer 20 can be increased. Accordingly, when the polyester-based resin substrate 40 and the copper alloy substrate 10 are bonded via the compound layer 20, the bonding strength can be increased.

Therefore, as compared to the case of bonding with only the first compound or only the second compound, in the case of bonding with the first compound and the second compound in combination, the bonding strength between the copper alloy substrate 10 and the polyester-based resin substrate 40 can be improved.

As described above, by using two types of compounds having different structures in combination, the copper alloy substrate 10 and the polyester-based resin substrate 40 can be firmly bonded, without roughening the surfaces of the copper alloy substrate 10 and the polyester-based resin substrate 40 and forming the metal oxide layer on the surface of the copper alloy substrate.

The "nitrogen-containing functional group" of the first compound preferably has a 5 or more-membered ring structure containing nitrogen. The 5 or more-membered ring structure containing nitrogen can be, for example, a triazole or triazine structure.

When the first compound has a 5 or more-membered ring structure, the structure of the first compound particularly becomes bulky, so that the first compounds are less likely to approach each other, and thus, the effect of improving the bonding strength is further pronounced by mixing the second compound with the first compound.

The fact that the compound layer includes the first compound and the second compound can be confirmed by an analysis method such as XPS analysis. For example, in the spectrum obtained by XPS analysis of the compound layer, within the range of the binding energy at which the N is peak appears, a peak attributed to a nitrogen atom bonded by a double bond, a peak attributed to a nitrogen atom of a primary amino group, a peak attributed to a nitrogen atom of a secondary amino group, and the like are included. Those peaks can be identified by an analysis spectrum of the XPS spectrum.

Here, since the nitrogen atom contained in the first compound and the nitrogen atom contained in the second compound are in different bonding states, the peaks of the XPS spectrum attributed to those nitrogen atoms can be identified. Thus, it can be specified that the first compound and the second compound are included in the compound layer.

Selection of Compound

In the following, bonding strengths between various compounds and a copper alloy substrate were compared.

As the compound, five types shown in Table 3 were selected (hereinafter, each compound is referred to by the symbol shown in Table 3). The chemical name of a compound is indicated when it is disclosed, but for the compound ImS of which the details are not disclosed, the disclosed basic structure is described. The main functional groups of these compounds are shown in Table 4. It is known that an alkoxysilane group becomes a silanol group in an aqueous solution. Among them, only the compound ET does not have an alkoxysilane group and is not a silane coupling agent.

TABLE 3

| Symbol | Compound | Manufacturer Product name |
|---|---|---|
| ET | 1,3,5-tris-(2,3-epoxypentyl)-1,3,5-triazin-2,4,6-(1H,3H,5H)-trione | Nissan Chemical Corporation TEPIC-VL |
| AST | 2-(3-triethoxysilylpropyl)amino-4,6-di(2-aminoethyl)amino-1,3,5-triazine | Sulfur Chemical Laboratory Inc. |
| ImS | Imidazole-based silane compound | JX Nippon Mining & Metals Corporation IS-1000 |
| AAS | N-2(aminoethyl)-3-aminopropyltrimethoxysilane | Shin-Etsu Chemical Co., Ltd. KBM-603 |
| AS | 3-aminopropyltrimethoxysilane | Shin-Etsu Chemical Co., Ltd. KBM-903 |

TABLE 4

| Symbol | Compound | Main functional group |
|---|---|---|
| ET | 1,3,5-tris-(2,3-epoxypentyl)-1,3,5-triazin-2,4,6-(1H,3H,5H)-trione | Basic structure: triazine 6-membered ring epoxy group oxo group |
| AST | 2-(3-triethoxysilylpropyl)amino-4,6-di(2-aminoethyl)amino-1,3,5-triazine | Basic structure: triazine 6-membered ring alkoxysilane group amino group |
| ImS | Imidazole-based silane compound | Basic structure: imidazole 5-membered ring alkoxysilane group |
| AAS | N-2(aminoethyl)-3-aminopropyltrimethoxysilane | Basic structure: alkane alkoxysilane group amino group |
| AS | 3-aminopropyl-trimethoxysilane | Basic structure: alkane alkoxysilane group amino group |

A copper foil, an LCP film (Vecstar CT-Z manufactured by KURARAY CO., LTD.), and a PET film (manufactured by Teijin Dupont Film, UF), which were cleaned with 1% hydrochloric acid for 1 minute and thoroughly washed with ion-exchanged water, were coated with five types of bonding compound aqueous solutions having a concentration of 0.1%, using a dip coater manufactured by J.P.C. Co., Ltd, dried, and then heat-treated at 100° C. for 5 minutes. The coating surface was analyzed by XPS analysis. The results of analysis are summarized in Table 7. As for the PET film, only the ET coating and the AST coating were performed.

TABLE 5

| | XPS analysis results | | |
|---|---|---|---|
| Symbol | Copper foil | LCP film | PET film |
| ET | Cu 2p orbital peak only a Cu (0 valent) peak in the vicinity of 930-935 eV and no Cu—N peak. Physical adsorption | C 1s orbital peak C—O at 286-288 eV, no chemical shift in C=O peak | C 1s is orbital peak C—O at 286-288 eV, no chemical shift in C=O peak |
| AST | Cu 2p orbital peak Cu—N bond peak in the vicinity of 936 eV. No Cu (0 valent) peak | C 1s orbital peak C—O at 286-288 eV, no chemical shift in C=O peak | Same as left |
| ImS | Cu 2p orbital peak Cu (0 valent) and Cu—N bond peak in the vicinity of 936 eV | C 1s orbital peak C—O at 286-288 eV, chemical shift in C=O peak. Unreacted ester group at 289 eV | |
| AAS | Cu 2p orbital peak Cu (0 valent) and Cu—N bond peak in the vicinity of 936 eV | C is orbital peak C—O at 286-288 eV, chemical shift in C=O peak. Unreacted ester group at 289 eV | |
| AS | Cu 2p orbital peak high Cu (0 valent) peak and Cu—N bond peak in the vicinity of 936 eV | C 1s orbital peak C—O at 286-288 eV, chemical shift in C=O peak. Unreacted ester group at 289 eV | |

Compound ET

A compound ET is a compound having a nitrogen-containing functional group and a silanol group (that is, the first compound), and the compound ET has three epoxy groups and three oxo groups (C=O) on a triazine 6-membered ring containing three nitrogen atoms (N). In the ET-coated copper foil, no peak indicating chemical adsorption between copper (Cu) and N atoms appeared. In ET-coated LCP and PET, no chemical shift of the peak indicating chemical adsorption with the epoxy group occurred. From these results, it was shown that ET was not chemically adsorbed on any surface of copper foil, LCP, and PET, but was only physically adsorbed thereon.

Compound AST

A compound AST is a compound having a nitrogen-containing functional group and a silanol group (that is, the first compound), and the compound AST has one alkoxysilane group and two amino groups on a triazine 6-membered ring containing three nitrogen atoms. In the copper foil coated with AST, from a Cu 2p orbital peak of copper, a peak indicating a bond between Cu and N was confirmed. Further, in LCP and PET coated with AST, peaks indicating C—O and C=O bonds appeared at 286 to 288 eV of the C is orbital peak, and both peaks were shifted from the original film peak position. These results show that in AST, the triazine 6-membered ring and N of the amino group chemically adsorbed on copper, and the silanol group is chemically adsorbed on the ester structure of LCP and PET.

Compound ImS

A compound ImS is a compound having a nitrogen-containing functional group and a silanol group (that is, a first compound), and has a structure in which a 5-membered imidazole ring and one alkoxysilane group are connected. In the copper foil coated with ImS, a Cu 2p orbital peak of copper shows that there is a peak indicating a bond between Cu and N, and the imidazole group is chemically adsorbed on copper. At the same time, there was also a peak of Cu (0 valent), indicating that there was a portion where ImS did not exist on the copper surface. In the AST, no Cu (0 valent) peak was observed, showing that AST was chemically adsorbed on the copper surface with a higher density than ImS was.

On the other hand, in the LCP coated with ImS, the peak indicating C—O and C=O bonds at 286 to 288 eV was shifted from the original peak position of the film, showing that the chemical adsorption occurred. In addition, there was a peak of an unreacted ester group at 289 eV, showing that there was a portion in LCP on which ImS was not chemically adsorbed. Since such peak of the unreacted ester group was not observed in AST, it is determined that AST has a higher chemical adsorbability to the ester structure of LCP than ImS has.

Compounds AAS and AS

Compounds AAS and AS are alkane-type amine-based silane coupling agents (that is, the second compounds), and are typical compounds which are widely applied to adhesion of copper and a resin in the prior art documents. However, in the copper foil coated with these compounds, it was shown from a Cu 2p orbital peak of copper that there was a peak of Cu (0 valent) like ImS, and there was a portion of the copper surface on which AAS or AS was not adsorbed. That is, it has been described in many documents that a silanol group is chemically adsorbed on a copper surface, but unlike the documents, it was found that the chemical adsorbability of these compounds was lowered on a sufficiently acid-cleaned copper surface.

As described above, when the copper surface was acid-cleaned until the applied antioxidant was completely removed, the copper oxide formed on the surface due to contact with the natural environment was also removed, and the amount present thereof was extremely decreased. For the silanol groups chemically adsorbed on the oxide, the number of adsorption sites was significantly decreased on the copper surface which was sufficiently acid-cleaned. On the other hand, since a Cu—N bond peak was observed, an amino group was chemically adsorbed on the surface of the copper foil, but at the same time, a peak of Cu (0 valent) also occurred due to the copper surface on which the compound is not adsorbed, showing that the amino group has low chemical adsorbability.

In LCP coated with AAS and AS, there was a peak of an unreacted ester group at 289 eV, and it was determined that the chemical adsorbability to LCP was low.

The substituent of a nitrogen-containing cyclic compound may be a ureido group, an isocyanate group, or the like, in addition to the amino group of AST.

Specification of Compounds Contained in Compound Layer

The relation between each compound and the XPS spectrum was examined, using ImS as the first compound and AAS as the second compound.

An aqueous solution containing a predetermined compound was applied to an LCP film, which was then heat-treated at 100° C. for 5 minutes. XPS analysis was performed on the film of the compound formed on the LCP film surface.

Figure 2:
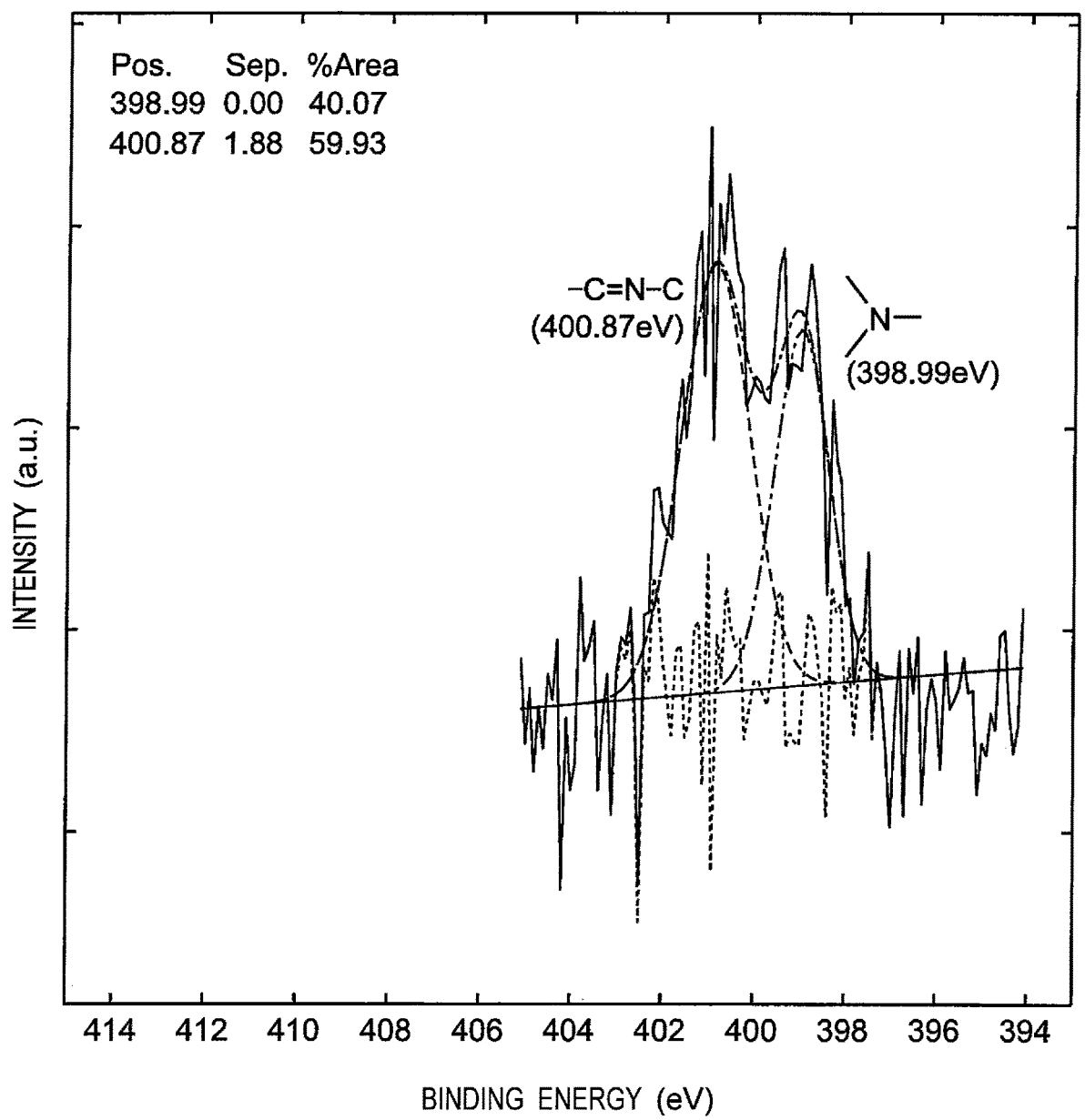
FIG. 2 is an XPS spectrum of a surface of an LCP film coated with ImS.

FIG. 2 shows the N is peak of the XPS spectrum of the ImS film, which is separated into two spectra by an XPS spectrum analysis software.

The first peak appearing at the position of a binding energy of 400.87 eV, is assigned to the nitrogen atom bonded by a double bond (labeled as "—C=N—C—" in FIG. 2) in the 5-membered imidazole ring.

The second peak appearing at the position of a binding energy of 398.99 eV is assigned to the amino-type nitrogen atom (labeled as ">N—" in FIG. 2) contained in the 5-membered imidazole ring.

The second peak intensity is almost the same as the first peak intensity.

Figure 3:
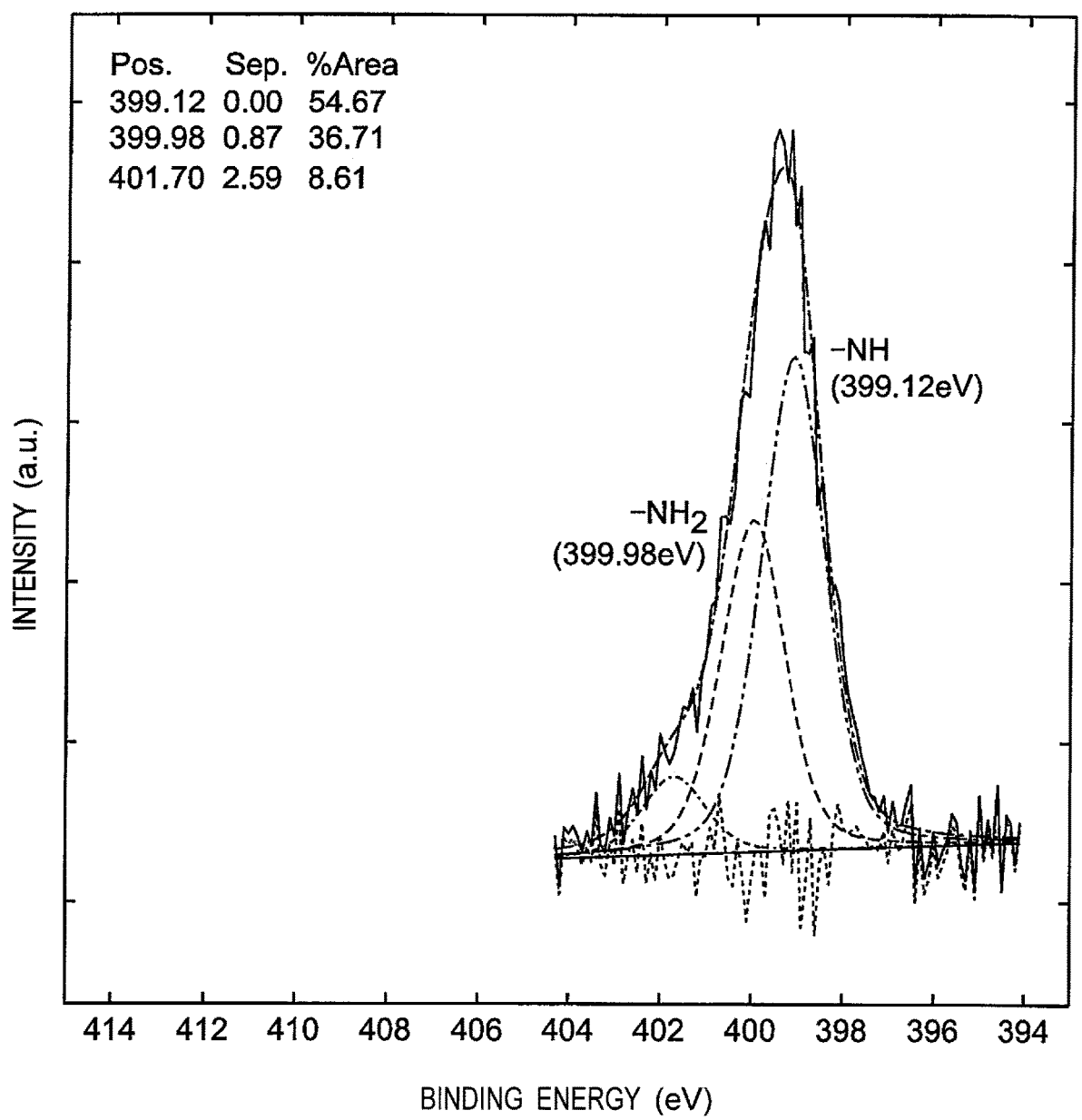
FIG. 3 is an XPS spectrum of a surface of an LCP film coated with AAS.

FIG. 3 shows the N is peak of the XPS spectrum of the AAS film, which is separated into three spectra by the analysis software. The peak appearing at the position of a binding energy of 399.98 eV is assigned to the nitrogen atom of the primary amino group (labeled as "—$NH_2$" in FIG. 3).

The peak appearing at the position of a binding energy of 399.12 eV is assigned to the nitrogen atom of the secondary amino group (labeled as "—NH" in FIG. 3).

Figure 4:
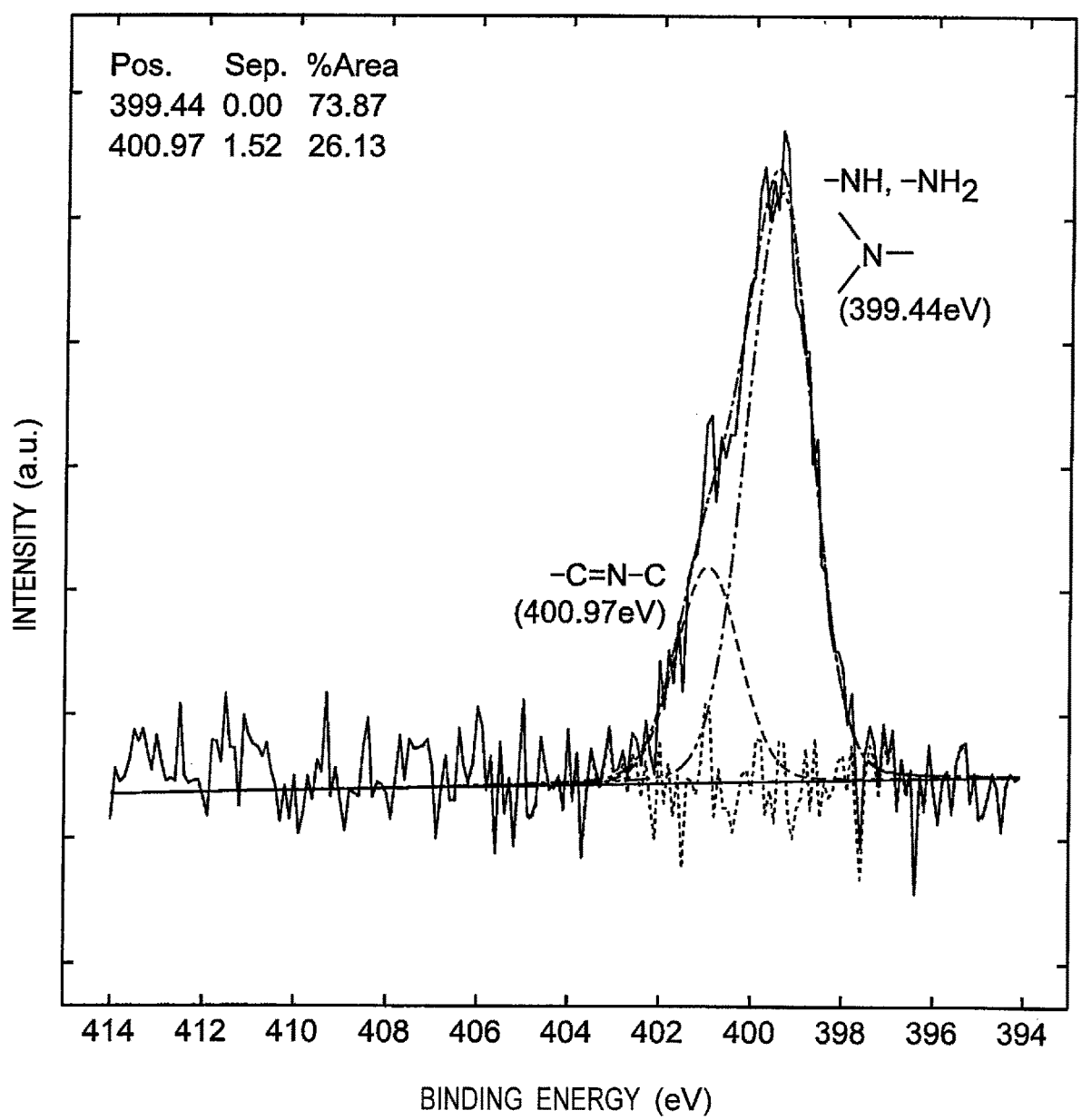
FIG. 4 is an XPS spectrum of a surface of an LCP film coated with a mixture ImS and AAS.

FIG. 4 shows the N 1s peak of the XPS spectrum of the film of the compound containing ImS and AAS, which is separated into two spectra by the analysis software. The first peak appearing at the position of a binding energy of 400.97 eV, is assigned to the nitrogen atom bonded by a double bond (labeled as "—C=N—C—" in FIG. 4) in the 5-membered imidazole ring. The presence of this peak indicates that the measured film of the compound contains ImS.

The second peak appearing at the position of a binding energy of 399.44 eV is formed by overlap of a peak attributed to the amino-type nitrogen atom (labeled as ">N—" in FIG. 4), a peak attributed to the nitrogen atom of the primary amino group (labeled as "—$NH_2$"), and a peak attributed to the nitrogen atom of the secondary amino group (labeled as "—NH"). The second peak intensity is about 2.5 times the first peak intensity. Upon comparison with the XPS spectrum of ImS shown in FIG. 2, the intensity of the second peak is significantly increased with respect to the first peak, and thus, it can be seen that a compound containing an amino group (AAS in this example) in addition to ImS is included in the film of the compound.

As such, when the film of the compound containing ImS which is the first compound is subjected to the XPS analysis, the peak (about 400.8 to about 401.0 eV) assigned to the nitrogen atom bonded by a double bond (—C=N—C—) is confirmed. Since this peak is separated from the peak (about 398.5 to about 400.0 eV) assigned to the nitrogen atom of the amino group contained in the second compound, it can be confirmed that the first compound and the second compound are included in the film of the compound.

Figure 5A:
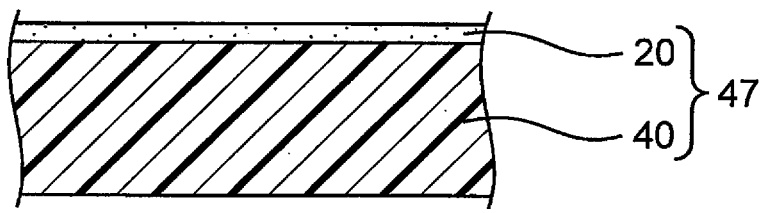
FIGS. 5(a) and 5(b) are schematic cross-sectional views for explaining a first method for manufacturing a copper alloy article.

Next, referring to FIGS. 5(a) and 5(b), a method of manufacturing the copper alloy article 3 according to the present embodiment will be described.

<1-1. Formation of Compound Layer 20>

A solution containing the first compound having a nitrogen-containing functional group and a silanol group and the second compound which is an alkane-type amine-based silane coupling agent was brought into contact with the surface of a polyester-based resin substrate 40. The solution can be brought into contact with the surface of the polyester-based resin substrate 40 by a known method such as coating or spraying. Thereafter, by performing a heat treatment, the compound layer 20 can be formed on the surface of the polyester-based resin substrate 40 (FIG. 5(a)). Thus, a polyester-based resin member 47 including the polyester-based resin substrate 40 and the compound layer 20 is obtained.

Instead of the solution containing the first compound and the second compound, a first solution containing the first compound and a second solution containing the second compound may be separately prepared. By sequentially bringing the first solution and the second solution into contact with the surface of the polyester-based resin substrate 40, the first compound and the second compound can be mixed and adsorbed on the surface of the polyester-based resin substrate 40. The second solution may be brought into contact after the first solution is brought into contact, or the first solution may be brought into contact after the second solution is brought into contact.

In the compound having a nitrogen-containing functional group and a silanol group, it is preferred that the nitrogen-containing functional group has a 5 or more-membered ring structure containing nitrogen. In particular, it is preferred that the 5 or more-membered ring structure is a triazole or triazine structure. Specific examples of the compound include AST, ImS, an AST-like compound in which some of the functional groups of AST are replaced with other functional groups, and an imidazole silane coupling agent, and the like, described in Table 5. Examples of the AST-like compound include a compound in which the triethoxy group of AST is a trimethoxy group, and a compound in which the amino substituent of the 4,6-di(2-aminoethyl) amino group of AST is an N-2-(aminoethyl)-3-aminopropyl group, a 3-aminopropyl group, an N-(1,3-dimethyl-methylidene)propylamino group, an N-phenyl-3-aminopropyl group, an N-(vinylbenzyl)-2-aminoethyl-3-aminopropyl group, or a 3-ureidopropyl group. Examples of the imidazole silane coupling agent include those having tris-(trimethoxysilyl-propyl) isocyanurate, any one of a 1-imidazolyl group, a 3-imidazolyl group, and a 4-imidazolyl group, and a trialkoxysilyl group such as a trimethoxy group and a triethoxy group, together.

As the alkane-type amine-based silane coupling agent, a linear alkane-type amine-based silane coupling agent is preferred. Specific examples of the compound include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, and the like.

<1-2. Cleaning of Copper Alloy Substrate 10>

The surface of the copper alloy substrate 10 is cleaned with an acid aqueous solution. This allows the oxide layer and the rust inhibitor present on the surface of the copper alloy substrate 10 to be removed.

As the acid aqueous solution, for example, an aqueous solution of an acid solution such as sulfuric acid, hydrochloric acid, a mixed solution of sulfuric acid and chromic acid, a mixed solution of sulfuric acid and hydrochloric acid, and a mixed solution of sulfuric acid and nitric acid can be used. Particularly, a sulfuric acid aqueous solution or a hydrochloric acid aqueous solution is preferred.

The cleaning can be performed by immersing the copper alloy substrate 10 in an acid aqueous solution for a predetermined time. The immersion time may be only within a range which allows removal of the oxide layer and the rust inhibitor on the surface and does not significantly erode the copper alloy substrate 10. For example, when 1% hydrochloric acid is used, immersion can be performed for 30 seconds to 10 minutes (for example, 1 minute). When 15% sulfuric acid is used, immersion may be performed for 1 to 20 minutes (for example, 5 minutes).

<1-3. Bonding of Copper Alloy Substrate 10 and Polyester-Based Resin Member 47>

Figure 5B:
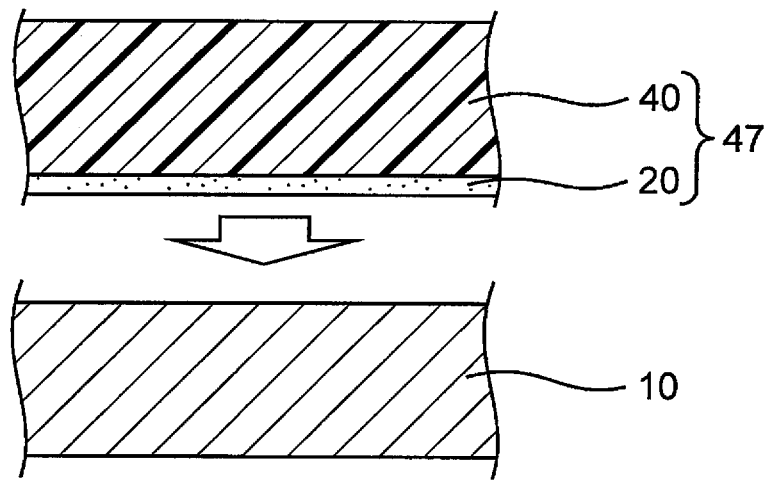

As shown in FIG. 5(b), the compound layer 20 of the polyester-based resin member 47 and the cleaned copper alloy substrate 10 are brought into contact with each other and pressed to bond the polyester-based resin member 47 and the copper alloy substrate 10, thereby obtaining the copper alloy article 3 as shown in FIG. 1. This can be regarded as bonding the polyester-based resin substrate 40 of the polyester-based resin member 47 and the copper alloy substrate 10 via the compound layer 20.

It is preferred to heat the copper alloy substrate 10 and the polyester-based resin member 47 before or during pressing, since the bonding becomes easier. The heating temperature is set to a temperature at which the polyester-based resin substrate 40 of the polyester-based resin member 47 does not melt. Pressing can be performed at a surface pressure of 1 MPa to 8 MPa, for example, 4 MPa.

As a modification example of the manufacturing method, the compound layer 20 may be formed on the surface of the copper alloy substrate 10. The modification example will be described with reference to FIGS. 6(*a*) and 6(*b*).

<2-1. Formation of Compound Layer 20>

A solution containing a compound having a nitrogen-containing functional group and a silanol group is brought into contact with the surface of the cleaned copper alloy substrate 10. Thereafter, a heat treatment can be performed to form the compound layer 20 on the surface of the copper alloy substrate 10 (FIG. 6(*a*)). Thus, a copper alloy member 15 including the copper alloy substrate 10 and the compound layer 20 is obtained. The details of the compound layer 20 are the same as those in Step 1-1.

<2-2. Cleaning of Copper Alloy Substrate 10>

The surface of the copper alloy substrate 10 is cleaned with an acid aqueous solution to remove the oxide layer and the rust inhibitor present on the surface of copper alloy substrate 10, in the same manner as in Step 1-2. of Embodiment 1.

<2-3. Bonding of Copper Alloy Member 15 and Polyester-Based Resin Substrate 40>

Figure 6A:
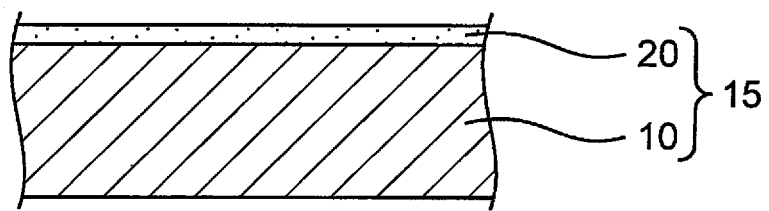
FIGS. 6(a) and 6(b) are schematic cross-sectional views for explaining a second method for producing a copper alloy article.
Figure 6B:
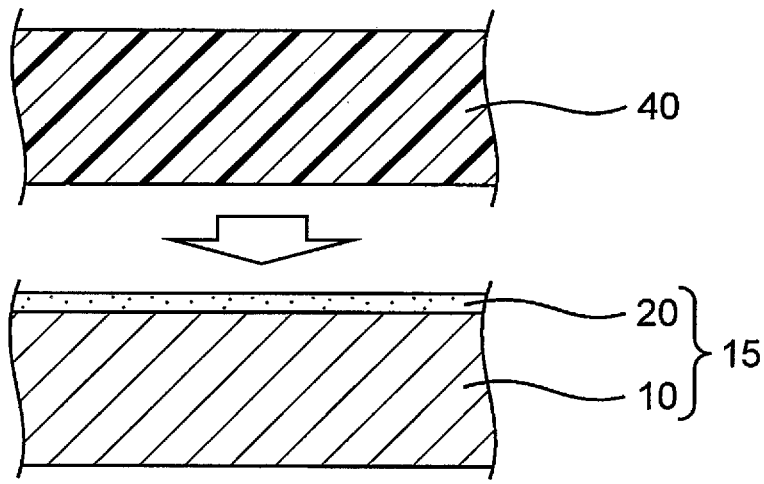

As shown in FIG. 6(*b*), the polyester-based resin substrate 40 and the compound layer 20 of the copper alloy member 15 are brought into contact with each other and pressed to bond the polyester-based resin substrate 40 and the copper alloy member 15, thereby obtaining the copper alloy article 3 as shown in FIG. 1.

The details of the pressure bonding are the same as those in Embodiment 1.

Incidentally, the polyester-based resin member 47 including the compound layer 20 (FIG. 5(*a*)) and the copper alloy member 15 including the compound layer 20 (FIG. 6(*a*)) are prepared, and the compound layers 20 are brought into contact with each other and pressed, thereby obtaining the copper alloy article 3 as shown in FIG. 1.

The compound layer of the polyester-based resin member 47 may be formed from the first solution containing the first compound having a nitrogen-containing functional group and a silanol group, and the compound layer of the copper alloy member 15 may be formed from the second solution containing the second compound which is an alkane-type amine-based silane coupling agent. When the compound layer of the polyester-based resin member 47 and the compound layer of the copper alloy member 15 are brought into contact during bonding, in the case in which the first compound included in one compound layer and the second compound included in the other compound layer are both chemically adsorbed, the compound layer 20 including the first compound and the second compound can be formed.

However, when the first compound included in one compound layer and the second compound included in the other compound layer are not sufficiently chemically adsorbed, the effect of improving the bonding strength may not be sufficiently exhibited, and thus, it is preferred to appropriately select a method of forming a compound layer, depending on the compound to be used.

The embodiments of the present invention will be described with reference to the examples.

Preparation Example

Characteristics of Each Compound

Four specimens (LCP film pieces) were prepared by cutting an LCP film CT-Z (manufactured by KURARAY CO., LTD.) having a thickness of 50 μm into a square having a side of 150 mm. Any one of four types of compound aqueous solutions (ET aqueous solution, AAS aqueous solution, ImS aqueous solution, and AST aqueous solution) was applied to both surfaces of the specimen of the LCP film, using a dip coater manufactured by JSP Corporation. The concentration of each aqueous solution was 0.1%.

A copper foil B (manufactured by UACJ corporation, thickness of 18 μm) was cleaned with 1% hydrochloric acid for 1 minute, then sufficiently washed with ion-exchanged water, and dried. Thereafter, eight specimens (copper foil pieces) obtained by cutting the copper foil B into 150 mm squares were also prepared. Then, any one of the above-described four types of compound aqueous solutions was applied to both surfaces of the copper foil specimen, using a dip coater manufactured by JSP Corporation. In addition, one type of compound aqueous solution was applied to two pieces of copper foil.

Thereafter, the LCP film piece and the copper foil piece to which the aqueous solution was applied were heat-treated at 100° C. for 5 minutes. Thus, compound layers were formed on both surfaces of the LCP film piece and both surfaces of the copper foil piece.

The copper foil pieces were placed on both surfaces of the LCP film piece on which the compound layer was formed, and while pressing at a surface thickness of 4 MPa with a vacuum press manufactured by KITAGAWA SEIKI Co., Ltd., the temperature was raised to 270° C., maintained for 20 minutes, and then kept at 290° C. for 10 minutes, thereby preparing a double-sided copper-clad laminate. In this double-sided copper-clad laminate, a compound layer is placed between the LCP film and the copper foil.

In this test, the compound aqueous solution was applied to both the LCP film and the copper foil, but even in the case in which the compound aqueous solution is applied to either one, the compound layer can be formed between the LCP film and the copper foil. That is, the surface to be applied can be appropriately determined, depending on the wettability of the compound solution, the easiness of forming the compound layer, the required amount of the compound, and the like.

As a comparative control, a double-sided copper-clad laminate was prepared in the same manner, using a specimen in which neither of the LCP film and the copper foil was coated with the compound aqueous solution.

A specimen in a strip shape was cut out from the double-sided copper-clad laminate, the entire surface of the copper foil on the rear was removed by etching according to JIS C 6471, Section 8.1, "Peel-off strength of copper foil", and a 10 mm wide pattern remained on the test surface by etching, thereby preparing a peel test specimen. The LCP film side on the rear of the peel test specimen was fixed to a reinforcing plate with double-sided tape, the copper foil was peeled off in a 180° direction at a peel speed of 50 mm/min, using Autograph AGS-5 kNX manufactured by Shimadzu Corporation, and a peel strength was measured for three pieces at one time under each condition. The minimum and maximum values were read from the peel test chart. Table 6 shows the results.

TABLE 6

| Compound | Peel strength (kN/m) (Minimum value/ maximum value) | Peeled state |
| --- | --- | --- |
| Absent | 0.16/0.20 | Interfacial peeling |
| ET | 0.08/0.11 | Interfacial peeling |
| AAS | 0.32/0.37 | Thin cohesive peeling |
| ImS | 0.39/0.44 | Cohesive peeling |
| AST | 0.59/0.68 | Cohesive peeling |

When the compound layer was not provided, the LCP film and the copper foil were not bonded, and peeling off occurred at the interface between the copper foil and the LCP film. The minimum and maximum values of the peel strength were 0.16 kN/m and 0.20 kN/m, respectively.

When the LCP film and the copper foil were bonded by the compound layer including the compound ET, peeling off occurred at the interface between the copper foil and the LCP film in a peeling test. The minimum and maximum values of the peel strength were 0.08 kN/m and 0.11 kN/m, respectively. That is, it can be said that the compound layer including the compound ET cannot bond the copper foil and the LCP film. As shown in the XPS analysis described above, since the Compound ET is not chemically adsorbed on either of the copper foil and the LCP film, it is considered that they could not be bonded. From the result, it was found that though the compound has a triazine 6-membered ring structure, when all the substituents of the nitrogen atom (N) are epoxy groups, that is, the compound has no alkoxysilane group, the LCP film and the copper foil cannot be bonded with a sufficient strength.

When the LCP film and the copper foil were bonded by the compound layer including the compound AAS, when the peeling interface of the copper foil was observed after the peeling test, a thin white LCP film remained (thin cohesive peeling). The minimum and maximum values of the peel strength were 0.32 kN/m and 0.37 kN/m, respectively. As shown in the XPS analysis described above, the compound AAS has low chemical adsorbability to either of the copper foil and the LCP film, and thus, is considered to have a relatively low peel strength.

When the LCP film and the copper foil were bonded by the compound layer including the compound ImS, when the peeling interface of the copper foil was observed after the peeling test, a white LCP film remained (cohesive peeling). The minimum and maximum values of the peel strength were 0.39 kN/m and 0.44 kN/m, respectively.

When the LCP film and the copper foil were bonded by the compound layer including the compound AST, when the peeling interface of the copper foil was observed after the peeling test, a white LCP film remained (cohesive peeling). The minimum and maximum values of the peel strength were 0.59 kN/m and 0.68 kN/m, respectively.

From these results, it was found that a cyclic molecular structure including a nitrogen atom (compound ImS, AST) is more effective in bonding of the copper metal substrate than an amino group on a linear saturated carbon of the alkane-type amine-based silane coupling agent (compound AAS).

Example 1, Comparative Example 1, and Comparative Example 2

The effect of adding a compound having a nitrogen atom-containing cyclic molecular structure (first compound) and an alkane-type amine-based silane coupling agent (second compound) in combination was examined.

A specimen (LCP film piece) was prepared by cutting an LCP film CT-Z (manufactured by KURARAY CO., LTD.) having a thickness of 50 μm into a square having a side of 150 mm. Four LCP film pieces were prepared. One of the compound aqueous solutions including the compound of Table 7 was applied to both surfaces of the LCP film piece, using a dip coater manufactured by JSP Corporation. Specifically, in Example 1, the compound layer was formed using a mixed aqueous solution containing 0.1% by weight of ImS and 1% by weight of AAS. In Comparative Example 1, an aqueous solution containing 0.1% by weight of ImS was used, and in Comparative Example 2, an aqueous solution containing 0.1% by weight of AAS was used.

A "copper foil B" (manufactured by UACJ corporation, thickness of 18 μm) shown in Table 1 was cleaned with 1% hydrochloric acid for 1 minute, then sufficiently washed with ion-exchanged water, and dried. Thereafter, a specimen (copper foil piece) obtained by cutting the copper foil B into 150 mm squares was prepared. Eight copper foil pieces were prepared. Then, any one of the above-described four types of compound aqueous solutions was applied to both surfaces of the copper foil piece, using a dip coater manufactured by JSP Corporation. In addition, one type of compound aqueous solution was applied to two pieces of copper foil.

Thereafter, the LCP film piece and the copper foil piece to which the aqueous solution was applied were heat-treated at 100° C. for 5 minutes. Thus, compound layers were formed on both surfaces of the LCP film piece and both surfaces of the copper foil piece.

The copper foil pieces were placed on both surfaces of the LCP film piece on which the compound layer was formed, and while pressing at a surface thickness of 4 MPa with a vacuum press manufactured by KITAGAWA SEIKI Co., Ltd., the temperature was raised to 270° C., maintained for 20 minutes, and then kept at 290° C. for 10 minutes, thereby preparing a double-sided copper-clad laminate. In this double-sided copper-clad laminate, a compound layer is placed between the LCP film and the copper foil.

Table 7 shows the results of the peel test.

TABLE 7

| | Compound | Peel strength (kN/m) (Minimum value/ maximum value) | Peeled state |
| --- | --- | --- | --- |
| Example 1 | ImS + AAS | 0.44/0.68 | Cohesive peeling |
| Comparative Example 1 | ImS | 0.39/0.44 | Cohesive peeling |
| Comparative Example 2 | AAS | 0.32/0.37 | Thin cohesive peeling |

As in Comparative Example 1, when the LCP film and the copper foil were bonded by a compound layer including only the compound ImS (first compound), the minimum and maximum values of the peel strength were 0.39 kN/m and 0.44 kN/m, respectively.

As in Comparative Example 2, when the LCP film and the copper foil were bonded by a compound layer including only the compound AAS (second compound), the minimum and maximum values of the peel strength were 0.32 kN/m and 0.37 kN/m, respectively.

In contrast, as in Example 1, when the LCP film and the copper foil were bonded by a compound layer including the compound ImS (first compound) and the compound AAS (second compound) in combination, the minimum and maximum values of the peel strength were 0.44 kN/m and 0.68 kN/m, respectively.

Comparing the maximum values of the peel strength, the peel strength of Example 1 was about 1.55 times the peel strength of Comparative Example 1 (0.68/0.44), and about 1.84 times the peel strength of Comparative Example 2 (0.68/0.37). In other words, it was found that the peel strength can be improved by 1.5 times or more as compared with the case of using each compound alone, only by mixing the compound ImS and the compound AAS as in Example 1. By comparing the maximum values, it is possible to know how much the maximum value of the bonding strength which can be realized by the compound layer as in Example 1 can be improved.

Example 2 and Comparative Example 3

In Example 2, a specimen ("double-sided copper-clad laminate" in which an LCP film piece and a copper foil piece were laminated) was prepared in the same manner as in Example 1, using a compound aqueous solution containing the compound of Table 8, and a peel test was performed. Specifically, in Example 2, the compound layer was formed using a mixed aqueous solution containing 0.1% by weight of AST and 1% by weight of AAS. In Comparative Example 3, an aqueous solution containing 0.1% by weight of AST was used.

Table 8 shows the results of the peel test.

TABLE 8

| | Compound | Peel strength (kN/m) (Minimum value/ maximum value) | Peeled state |
|---|---|---|---|
| Example 2 | AST + AAS | 0.68/0.77 | Cohesive peeling |
| Comparative Example 2 | AAS | 0.32/0.37 | Thin cohesive peeling |
| Comparative Example 3 | AST | 0.59/0.68 | Cohesive peeling |

As described above, in Comparative Example 2, when the LCP film and the copper foil were bonded by a compound layer including only the compound AAS (second compound), the minimum and maximum values of the peel strength were 0.32 kN/m and 0.37 kN/m, respectively.

As in Comparative Example 3, when the LCP film and the copper foil were bonded by a compound layer including only the compound AST (first compound), the minimum and maximum values of the peel strength were 0.59 kN/m and 0.68 kN/m, respectively.

In contrast, as in Example 2, when the LCP film and the copper foil were bonded by a compound layer including the compound AST (first compound) and the compound AAS (second compound) in combination, the minimum and maximum values of the peel strength were 0.68 kN/m and 0.77 kN/m, respectively.

Comparing the maximum values of the peel strength, the peel strength of Example 2 was about 2.08 times the peel strength of Comparative Example 2 (0.77/0.37), and about 1.13 times the peel strength of Comparative Example 3 (0.77/0.68). In other words, it was found that the peel strength can be improved by 1.13 times or more as compared with the case of using each compound alone, only by mixing the compound AST and the compound AAS as in Example 2. The bonding strength by using AST alone is sufficiently high among conventional silane coupling agents, but according to the embodiment of the present invention, the bonding strength can be further improved.

Based on the experimental results of Examples 1 and 2, the mechanism of micro-chemical adsorption is estimated. Since the first compound having a cyclic molecular structure containing a nitrogen atom (for example, the compounds ImS and AST) has a large molecular structure, there occurs a gap between molecules during chemical adsorption. A second compound having a low molecular weight and a chain structure (for example, the compound AAS) has the effect of entering the gap between the molecules of the first compounds ImS and AST and closing the gap. Thus, it is considered that the chemical adsorption density of a total of the first compound and the second compound can be increased, and as a result, the bonding strength between the LCP film and the copper foil can be improved.

Examples 3 to 7 and Comparative Examples 4 to 5

In Examples 3 to 7, (A) a peel test, (B) XPS analysis, and (C) an FT-IR test were performed.

(A) Peel Test

The relation between the mixing ratio of the compounds AST and AAS used in Example 2 and the bonding strength was examined.

In a mixed aqueous solution containing the first compound (compound AST) and the second compound (compound AAS), the total molar concentration of AST and AAS was fixed at 48 mmol/L, and the concentration of AST and AAS was changed from 1:0 to 1:15 as a molar ratio (from 2:0 to approximately 0.1:1.0 as a % by weight ratio). Here, the reason why the molar concentration was constant is that the characteristics of the compounds can be correctly compared by comparing the number of molecules in the solution. That is, the relation between the chemical adsorbability of each molecule and the bonding strength can be correctly compared, by specifying in the molar concentration.

A specimen (double-sided copper-clad laminate) used in the peel test was formed in the same manner as in Example 1.

Table 9 shows the details of the addition in combination and the measurement results of the peel strength.

TABLE 9

| | | Comparative Example 4 | Example 3 | Example 4 | Example 5 | Example 6 | Example 7 | Comparative Example 5 |
|---|---|---|---|---|---|---|---|---|
| AST:AAS | mmol/L | 1:0 | 1:0.5 | 1:1 | 1:2 | 1:10 | 1:15 | 0:1 |
| AST | % by weight | 2 | 1.33 | 1.00 | 0.67 | 0.18 | 0.13 | — |
| | mmol/L | 48 | 32 | 24 | 16 | 4.4 | 3 | — |

TABLE 9-continued

| | | Comparative Example 4 | Example 3 | Example 4 | Example 5 | Example 6 | Example 7 | Comparative Example 5 |
|---|---|---|---|---|---|---|---|---|
| AAS | % by weight | — | 0.36 | 0.53 | 0.71 | 0.97 | 1.01 | 1.07 |
| | mmol/L | — | 16 | 24 | 32 | 43.6 | 45 | 48 |
| Total | % by weight | 2 | 1.69 | 1.53 | 1.38 | 1.15 | 1.14 | 1.07 |
| | mmol/L | 48 | 48 | 48 | 48 | 48 | 48 | 48 |
| Peel strength (Minimum value/maximum value) | kN/m | 0.60/0.65 | 0.63/0.67 | 0.69/0.71 | 0.68/0.74 | 0.70/0.73 | 0.55/0.61 | 0.42/0.47 |

When a specimen was prepared using the aqueous solution containing only the compound AST as in Comparative Example 4, the minimum and maximum values of the peel strength were 0.60 kN/m and 0.65 kN/m, respectively. When a specimen is prepared using a mixed aqueous solution of the compound AST and the compound AAS by replacing a part of the compound AST with the compound AAS, the peel strength tends to be improved. For example, in Examples 3 to 6, the minimum value of the peel strength is 0.63 to 0.70 kN/m, and the maximum value thereof is 0.67 to 0.73 kN/m. In Example 6 having the highest peel strength, the maximum value of the peel strength was about 1.12 times that of Comparative Example 4 (0.73/0.65).

The minimum and maximum values of the peel strength of Example 7 were 0.55 kN/m and 0.61 kN/m, respectively, which were lower than those of Comparative Example 4, but were higher than the peel strength (the minimum value of 0.42 kN/m and the maximum value of 0.47 kN/m) of Comparative Example 5 (using an aqueous solution containing only AAS).

When both the first compound (AST) and the second compound (AAS) were added in combination to the compound aqueous solution (Examples 3 to 7), it was shown that the peel strength can be improved, as compared with the case of including only the second compound (AAS) (Comparative Example 5). In particular, when the first compound (AST) and the second compound (AAS) were added at a predetermined ratio (AST:AAS=1:0.5 to 1:10) (Examples 3 to 6), it was shown that the peel strength can be improved, as compared with the case of including only the first compound (AST) (Comparative Example 4).

In particular, it is preferred that the molar ratio of the first compound (AST):the second compound (AAS) is 1:1 to 1:10 (Examples 4 to 6), and the maximum value of a tensile strength of 0.70 kN/m or more, which could not be achieved with the conventional compound, can achieve an extremely strong bonding strength.

(B) XPS Analysis

The relationship between the mixing ratio of the first compound (AST) and the second compound (AAS) and the state of chemical adsorption of the compound on the surface of the copper foil was examined.

A mixed aqueous solution containing the first compound (compound AST) and the second compound (compound AAS) was applied to the surface of the copper foil piece. The mixed aqueous solutions to be used are the same as those used in Examples 3 to 6 and Comparative Examples 4 to 5 (see Table 9).

Any one of the aqueous solutions is applied to the surface (both surfaces) of the copper foil piece, using a dip coater manufactured by JSP Corporation. Thereafter, the copper foil piece was heat-treated at 100° C. for 5 minutes to form a compound layer on the surface of the copper foil piece, and the surface of the copper foil piece coated with the compound layer was subjected to XPS analysis. XPS spectrum of each copper foil piece is shown in FIGS. 7 to 12.

In order to examine the chemical adsorption of the compound on the surface of the copper foil, the XPS spectrum was analyzed focusing on the Cu 2p orbital peak of the XPS spectrum. As the Cu 2p orbital peak, a Cu—N bond peak, a Cu—O bond peak, and a Cu (0 valent) peak are mainly observed. In FIG. 7 to 12, the Cu—N bond peak is labeled as "Cu—N", the Cu—O bond peak is labeled as "Cu—O", and the Cu (0 valent) peak is labeled as "Cu (0)".

Each peak is interpreted as follows.

(i) The Cu—N bond peak shows that a triazine ring and an amino group (both derived from AST) in the compound layer are chemically adsorbed on the surface of the copper foil.

(ii) The Cu—O bond peak shows that a silanol group (derived from AST) in the compound layer is chemically adsorbed on the surface of the copper foil.

(iii) The Cu (0 valent) peak shows that there is a surface of the copper foil on which no compound is chemically adsorbed.

Figure 7:
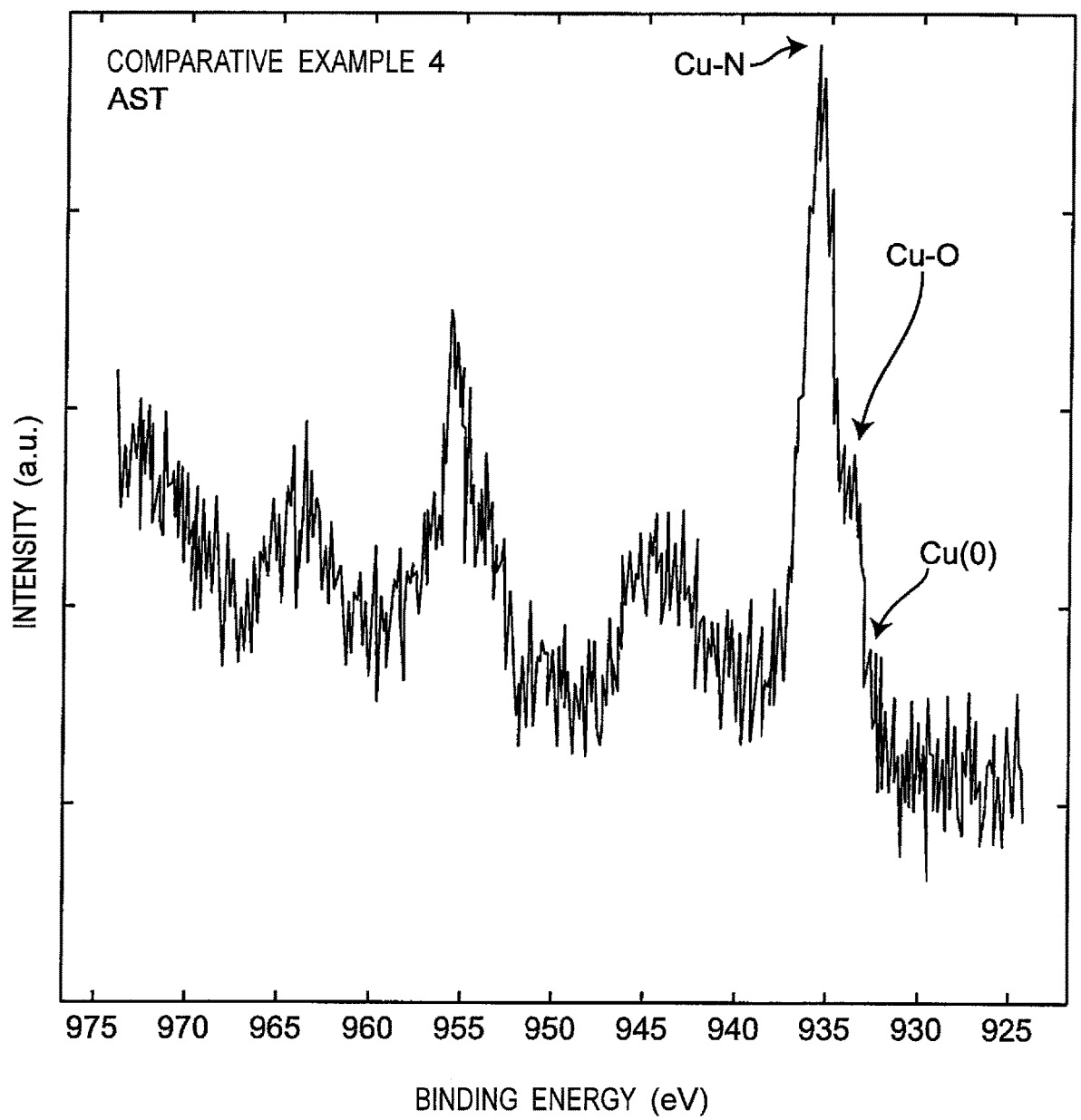
FIG. 7 is an XPS spectrum of a surface of a copper foil piece coated with AST.

FIG. 7 is an XPS spectrum of a copper foil piece having a compound layer formed by the AST aqueous solution (see Table 9) used in Comparative Example 4. When the peak of the Cu 2p orbital was analyzed in detail, a slightly smaller Cu—O bond peak was observed in addition to the main Cu—N bond peak (Table 5). The Cu (0 valent) peak was not observed behind the noise.

The silanol group shown by the Cu—O bond peak is a functional group contributing to chemical adsorption with an ester structure contained in LCP, PET, and the like. Therefore, in order to improve the peel strength of the copper foil and the resin film having an ester structure, it is considered to be preferred that the ratio of the silanol groups chemically adsorbed on the surface of the copper foil (that is, the consumed silanol groups) is small. That is, it is preferred that no Cu—O bond peak is observed (or the peak is as small as possible) in the XPS spectrum.

Figure 8:
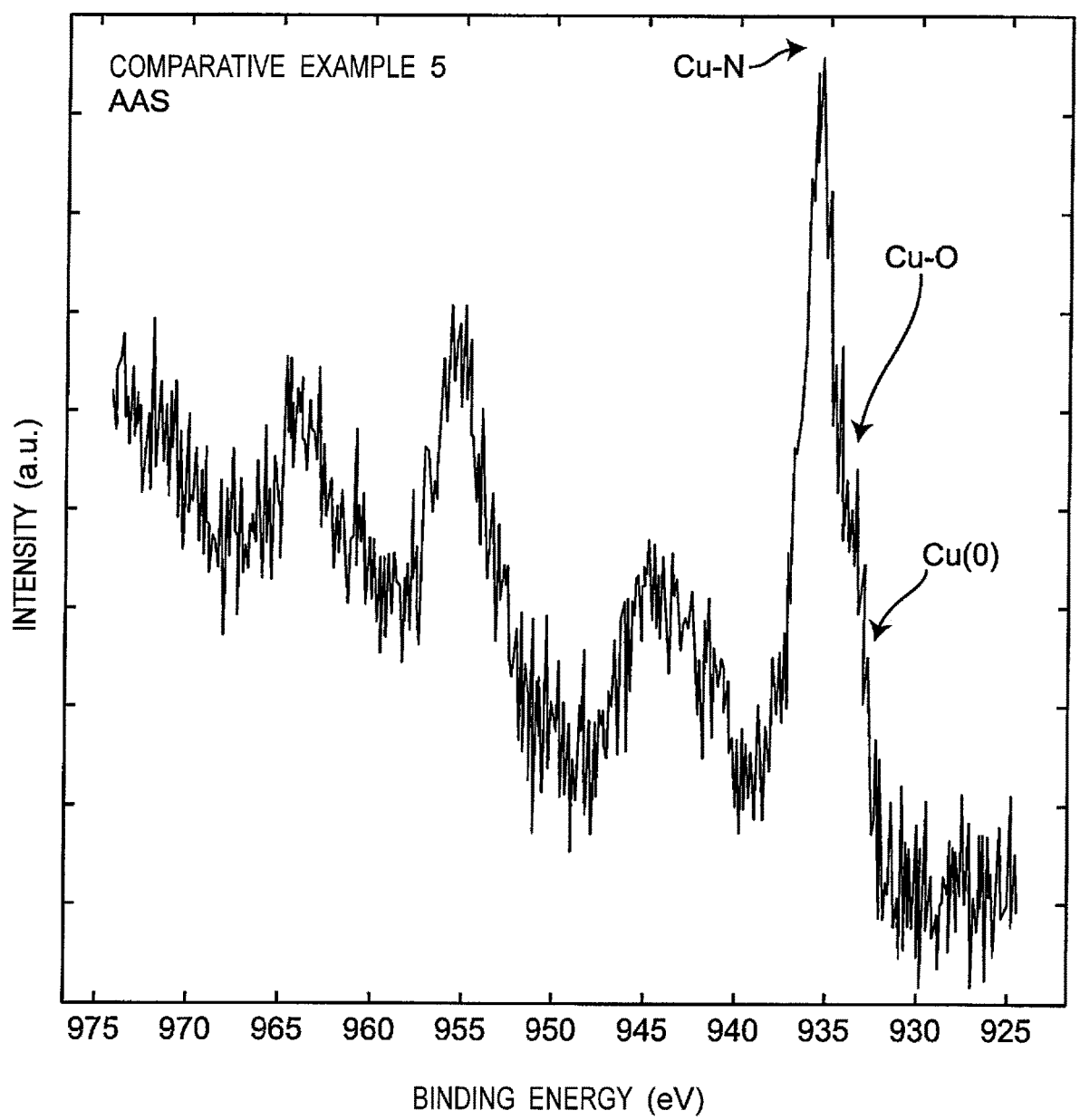
FIG. 8 is an XPS spectrum of a surface of a copper foil piece coated with AAS.

FIG. 8 is an XPS spectrum of the copper foil piece having a compound layer formed by the AAS aqueous solution (see Table 9) used in Comparative Example 5. When the peak of the Cu 2p orbital in the XPS spectrum of FIG. 8 is analyzed in detail, similarly to the XPS spectrum of FIG. 7 (AST coating), Cu (0 valent) peak was also observed, in addition to the Cu—N bond peak and the rather small Cu—O bond peak, as in the XPS spectrum (coated with AST) of FIG. 7.

Figure 9:
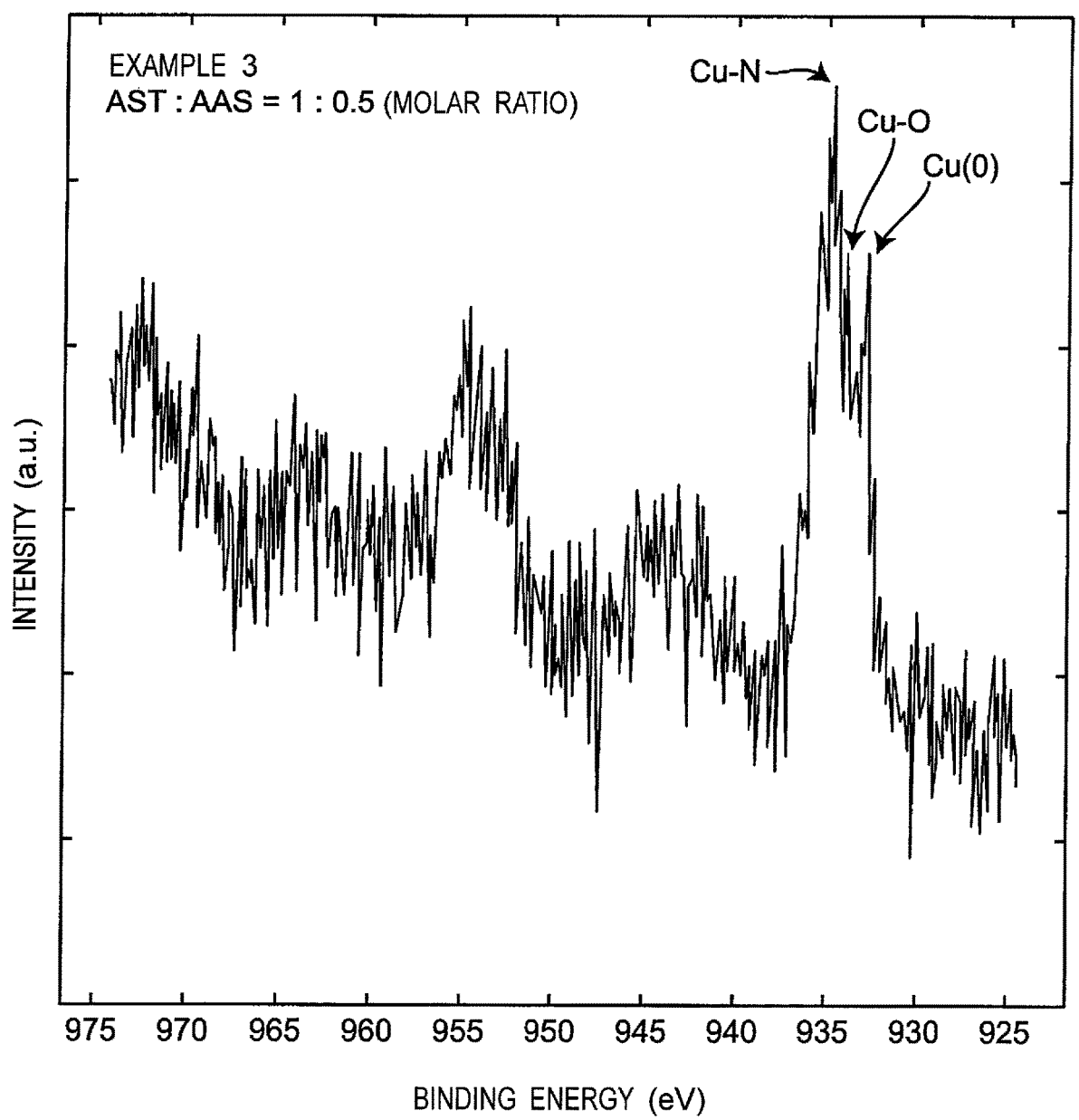
FIG. 9 is an XPS spectrum of a surface of a copper foil piece coated with a mixed aqueous solution of AST and AAS.
Figure 10:
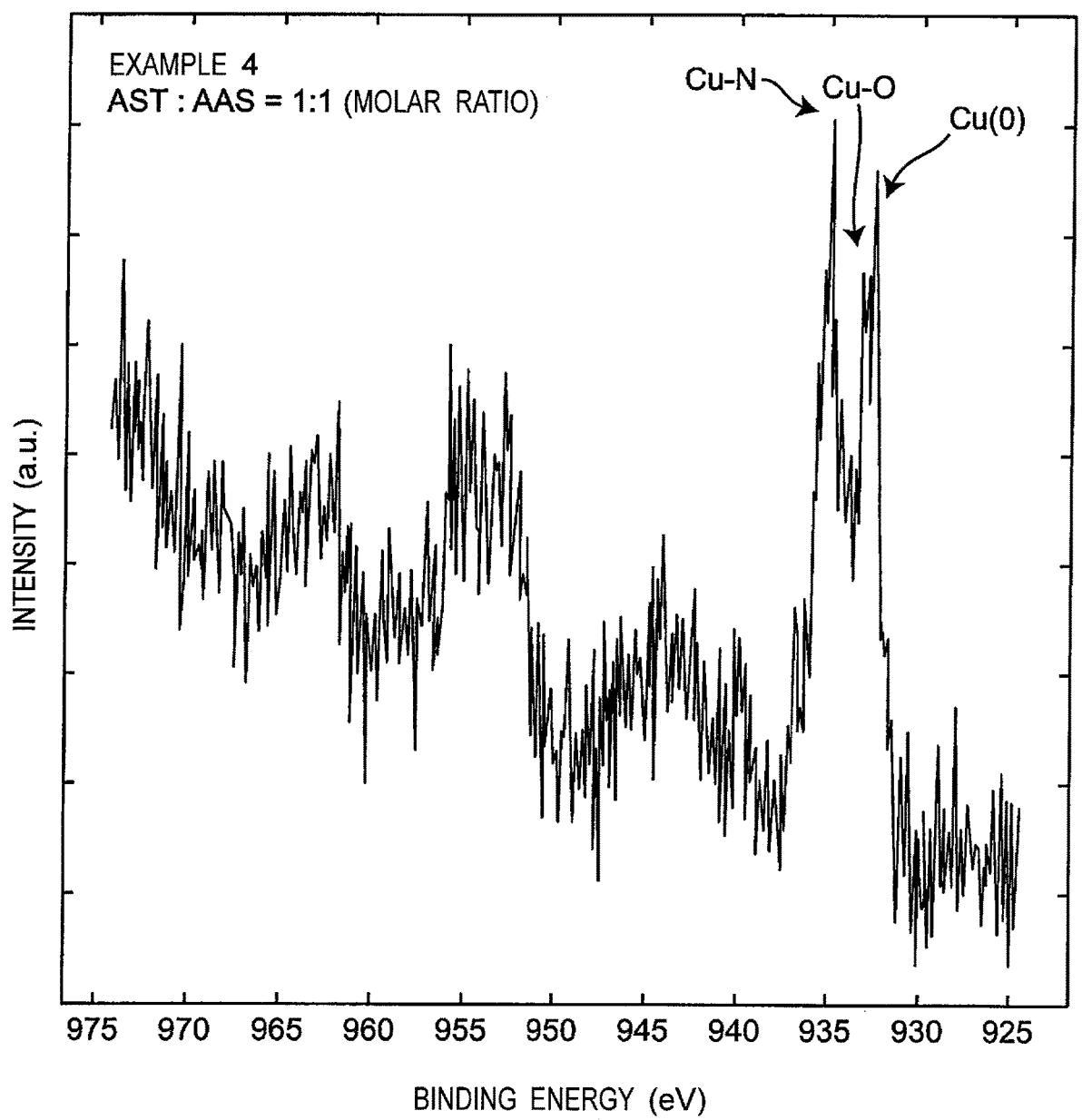
FIG. 10 is an XPS spectrum of a surface of a copper foil piece coated with a mixed aqueous solution of AST and AAS.
Figure 11:
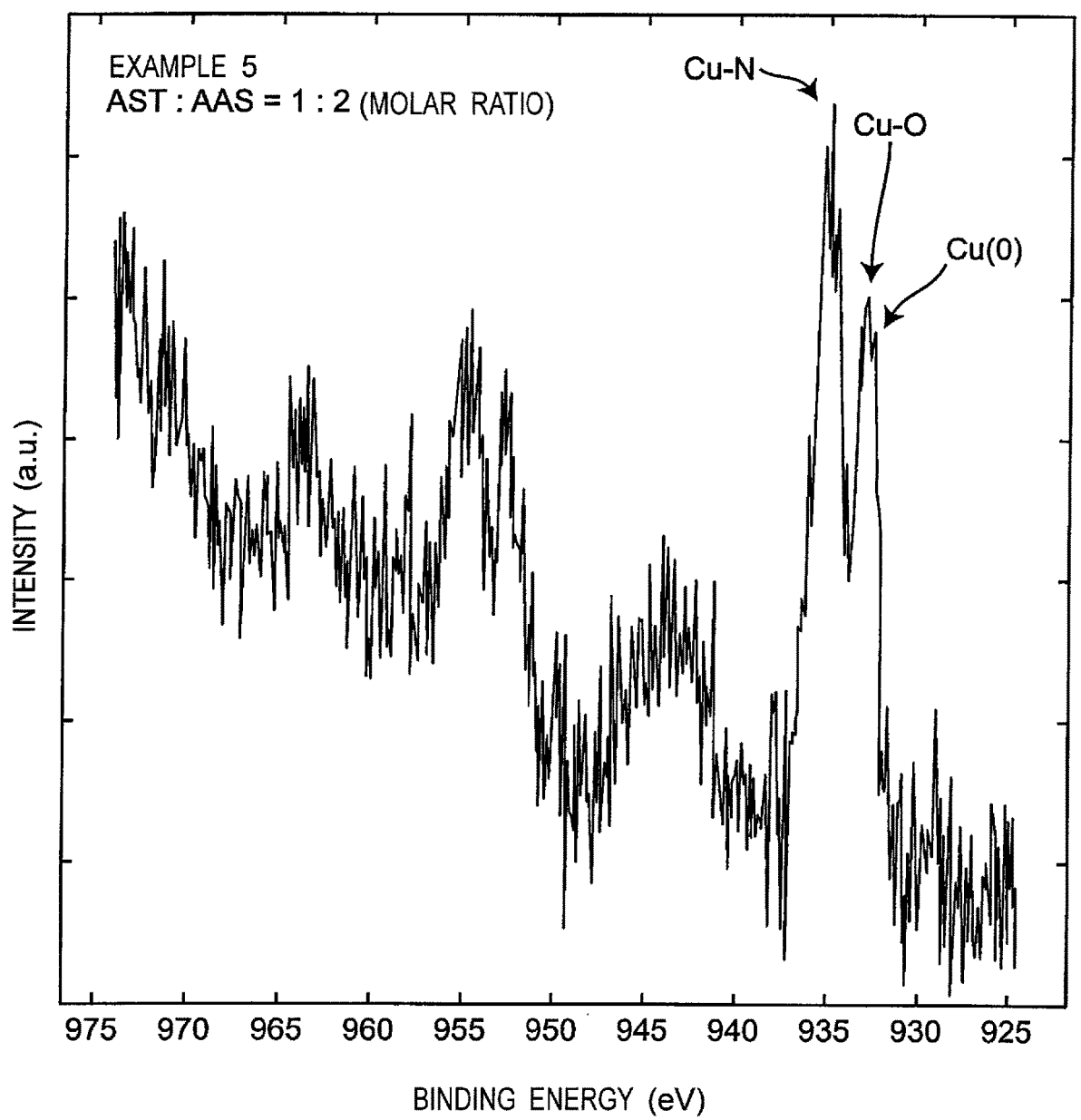
FIG. 11 is an XPS spectrum of a surface of a copper foil piece coated with a mixed aqueous solution of AST and AAS.

FIGS. 9 to 11 are XPS spectra of copper foil pieces having a compound layer formed by a mixed aqueous solution of AST and AAS (see Table 9) used in Examples 3 to 5.

In FIG. 9, the molar ratio of AST and AAS in the mixed aqueous solution to be used is 1:0.5, in FIG. 10, the molar ratio is 1:1, and in FIG. 11, the molar ratio is 1:2. In the XPS spectra of FIGS. 9 to 11, a main Cu—N bond peak, a Cu—O bond peak, and a peak of Cu (0 valent) were observed. In those XPS spectra, the peak intensities of the Cu—O bond peak and Cu (0 valent) peak are larger than those of FIGS. 7 and 8, and are close to the peak intensity of the Cu—N bond peak. That is, by mixing AAS with AST, a Cu (0 valent) peak, which was not observed in FIG. 7 (AST alone), was observed, and the peak intensity of the Cu—O bond peak was increased to the same level as the Cu—N bond peak.

Therefore, the following tendency was able to be confirmed when the molar ratio of AST to AAS in the mixed aqueous solution was 1:0.5 to 1:2.

Since the peak intensity of the Cu (0 valent) peak is increased, the density of chemical adsorption of the compound on the surface of the copper foil is decreased.

Since the peak intensity of the Cu—O bond peak is increased, it is considered that many silanol groups are chemically adsorbed on the surface of the copper foil and are consumed much thereon. As described above, since the silanol group is chemically adsorbed on the ester structure of the resin film, it is not preferred that the silanol group is consumed on the surface of the copper foil.

From the viewpoint of the chemical adsorption of the compound on the surface of the copper foil, these results can be regarded as being a state in which the effect of adding AAS to AST is not sufficiently exhibited.

When the Cu 2p spectrum is analyzed in further detail, in FIG. 9 (at a molar ratio of AST to AAS of 1:0.5), the peak intensities of the Cu—O bond peak and the Cu (0 valent) peak are almost the same. In FIG. 10 (at a molar ratio of 1:1), the peak intensity of the Cu (0 valent) peak is larger than that of the Cu—O bond peak. In FIG. 11 (at a molar ratio of 1:2), the peak height of the Cu (0 valent) peak was slightly lower than that of the Cu—O bond peak. As such, it was found that by changing the molar ratio of AST and AAS in the mixed aqueous solution, the peak intensities of the Cu (0 valent) peak and the Cu—O bond peak were changed, and the state of the chemical adsorption of the compound on the surface of the copper foil was changed.

Figure 12:
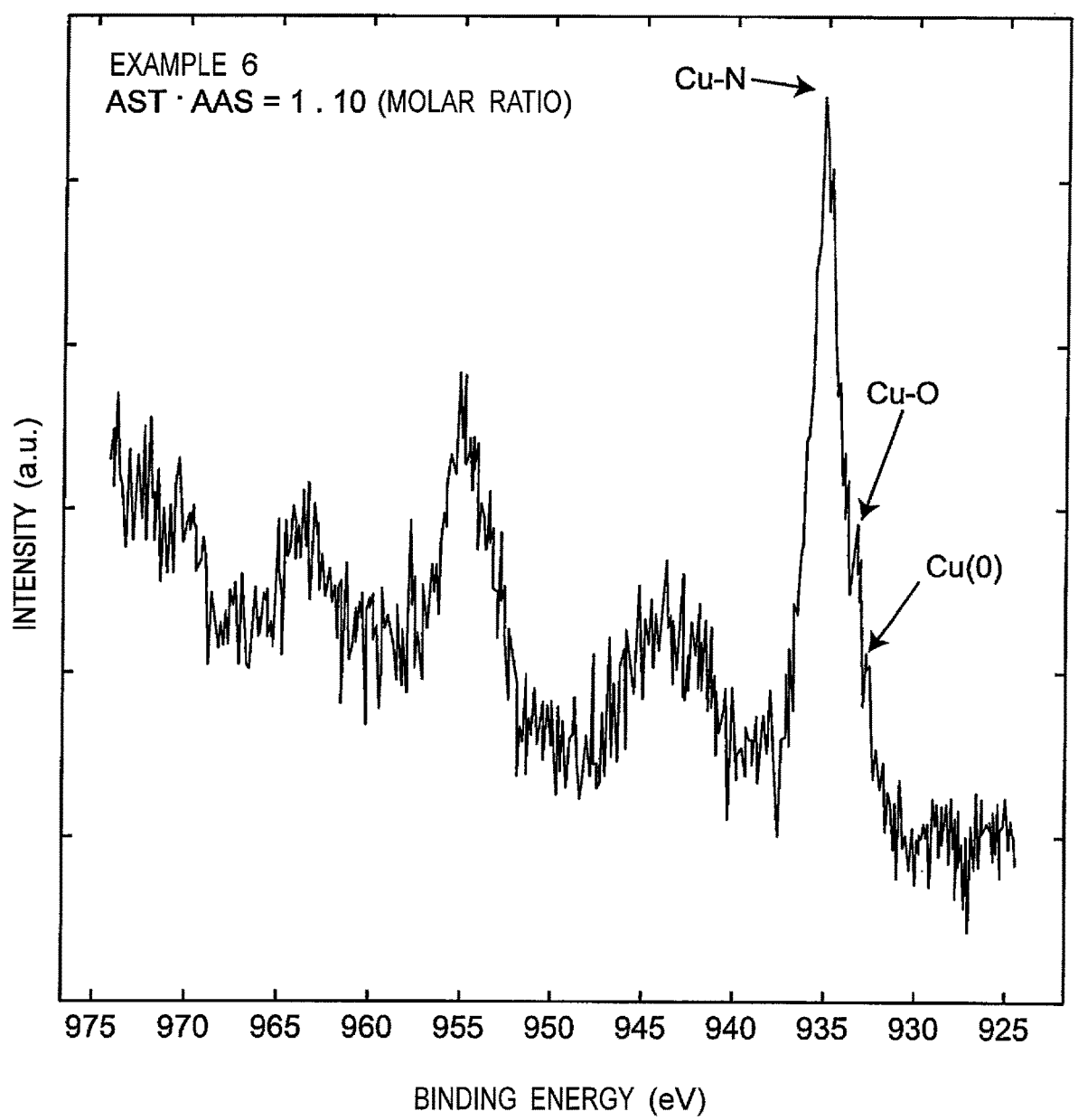
FIG. 12 is an XPS spectrum of a surface of a copper foil piece coated with a mixed aqueous solution of AST and AAS.

FIG. 12 is an XPS spectrum of a copper foil piece having a compound layer formed by a mixed aqueous solution of AST and AAS (see Table 9) used in Example 6. The molar ratio of AST to AAS in the mixed aqueous solution used is 1:10.

In FIG. 12, the peak intensities of Cu—O and Cu (0 valent) became significantly lower than the Cu—N bond peak, and the peak of Cu (0 valent) almost disappeared. Since the peak of Cu (0 valent) almost disappeared, it is determined that the copper surface was almost covered with the compound layer on the surface of the copper foil. In addition, since the Cu—O bond peak was significantly lowered, it can be seen that the ratio of the silanol group which was not chemically adsorbed on the surface of the copper foil was high. That is, many silanol groups which can be chemically adsorbed on the ester structure of the resin film remain.

If the ratio of AAS is high, the effect of mixing AST and AAS cannot be obtained. For example, as shown in Table 9, since the ratio of AAS in the mixed aqueous solution was too high (the molar ratio AST and AAS was 1:15) in Example 7, the peel strength was significantly decreased. In the embodiment, it is considered that the effect of AAS is the main.

From the results of the (A) peel test and the (B) XPS analysis (Table 9 and FIGS. 9 to 12), it was found that the effect of improving the peel strength was obtained in the range of the molar ratio of AST to AAS in the mixed aqueous solution of 1:0.5 to 1:15, and thus, the effect was maximized particularly at the molar ratio of 1:10.

As described above, it was confirmed that a compound layer having a high bonding strength can be formed by mixing the first compound having a bulky cyclic structure and the second compound having a linear structure. Furthermore, it was confirmed that by appropriately adjusting the mixing ratio of these compounds, it is possible to particularly effectively use the difference in the three-dimensional structure between the compound having a bulky cyclic structure and the compound having a linear structure, and the density and structure of the chemical adsorption of the compound to the copper foil and the resin film having an ester structure can be optimized.

In other words, in order to maximize the effects of the present invention, it is important not only to mix a plurality of widely used linear silane coupling agents and/or to mix a plurality of bulky compounds, but also to appropriately adjust the selection of the compound and the mixing ratio thereof.

(C) FT-IR Analysis

The bonding state of the compound layer and the LCP film surface was examined.

The specimens (double-sided copper-clad laminates) of Comparative Examples 4 to 5 and Example 6 were prepared in the same manner as in the above "(A) Peel test". The obtained copper-clad laminate was immersed in a 30 to 35% ferric chloride aqueous solution at a temperature of 60° C. for 5 to 6 minutes to dissolve and remove the copper foil (wet etching). Thus, the compound layer formed between the copper foil and the LPC film piece was exposed. Thereafter, the specimen was washed with ion-exchanged water and dried in an oven at 80° C. for 30 minutes to obtain an LPC specimen for FT-IR analysis (an LPC film piece coated with a compound layer).

For the LPC specimen for measurement, the surface coated with the compound layer was subjected to FT-IR analysis. For FT-IR analysis, a Fourier transform infrared spectrophotometer FT/IR680 Plus manufactured by JASCO Corporation equipped with a multiple total reflection measuring device ATR500/M manufactured by JASCO Corporation was used, and measurement was performed by an attenuated total reflection (ATR) method. In the multiple total reflection measuring device, a Ge prism was used and measuring was performed with 5 reflections at an incident angle of 45°. FT-IR charts of each LPC specimen are shown in FIGS. 13 to 15.

Figure 13:
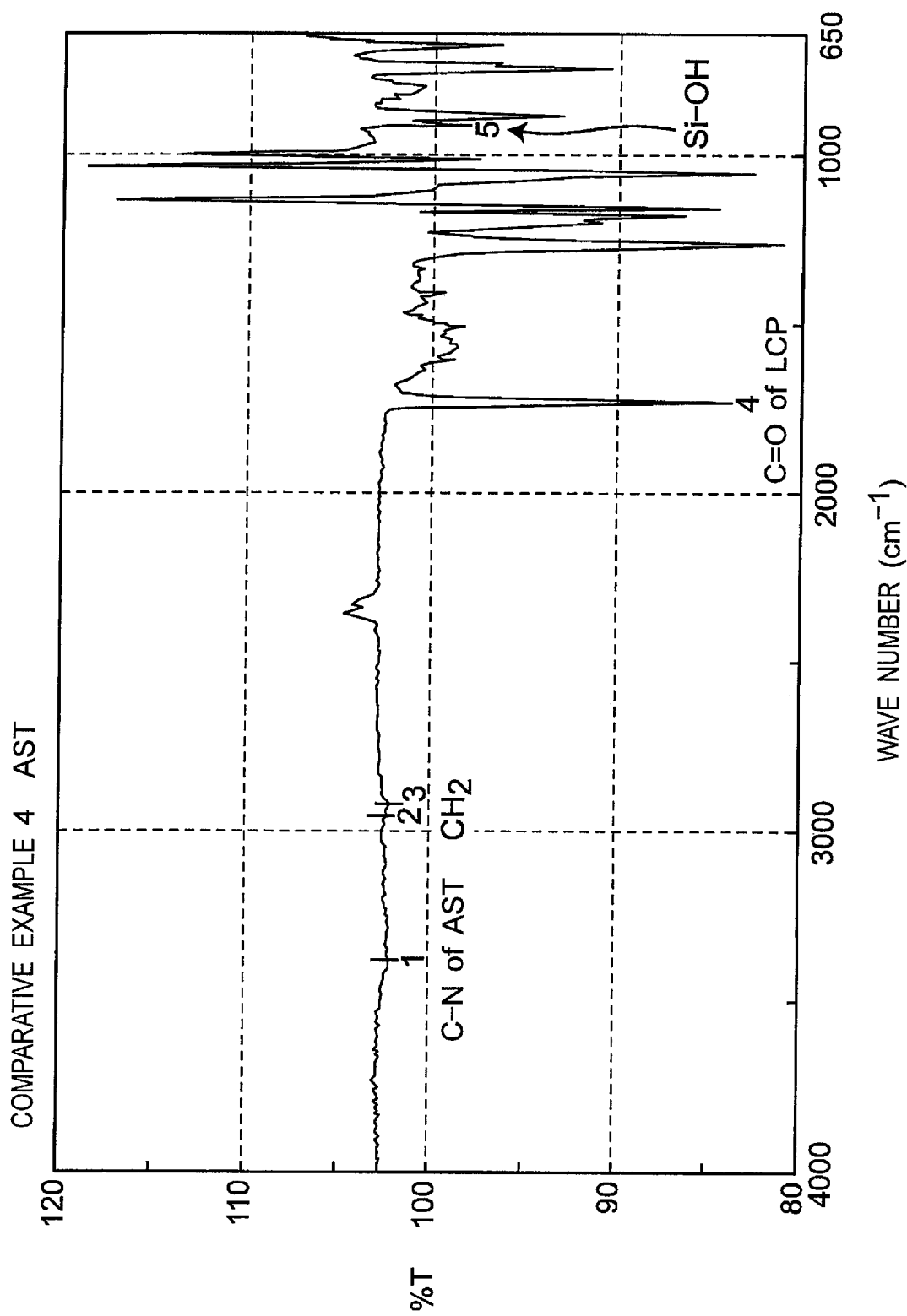
FIG. 13 is an FT-IR chart of an LPC specimen prepared from a copper-clad laminate of Comparative Example 4.

FIG. 13 is an FT-IR chart of an LPC specimen prepared from the copper-clad laminate of Comparative Example 4. A peak of a C—N group of a triazine ring of AST at 3383 $cm^{-1}$ (weakly broad), peaks of a $CH_2$ group at 2962 $cm^{-1}$ and 2926 $cm^{-1}$ (weak), a peak of a C=O group of an ester group of the LCP film at 1735 $cm^{-1}$, and a peak of a Si—OH group of AST at 914 $cm^{-1}$ were detected.

Figure 14:
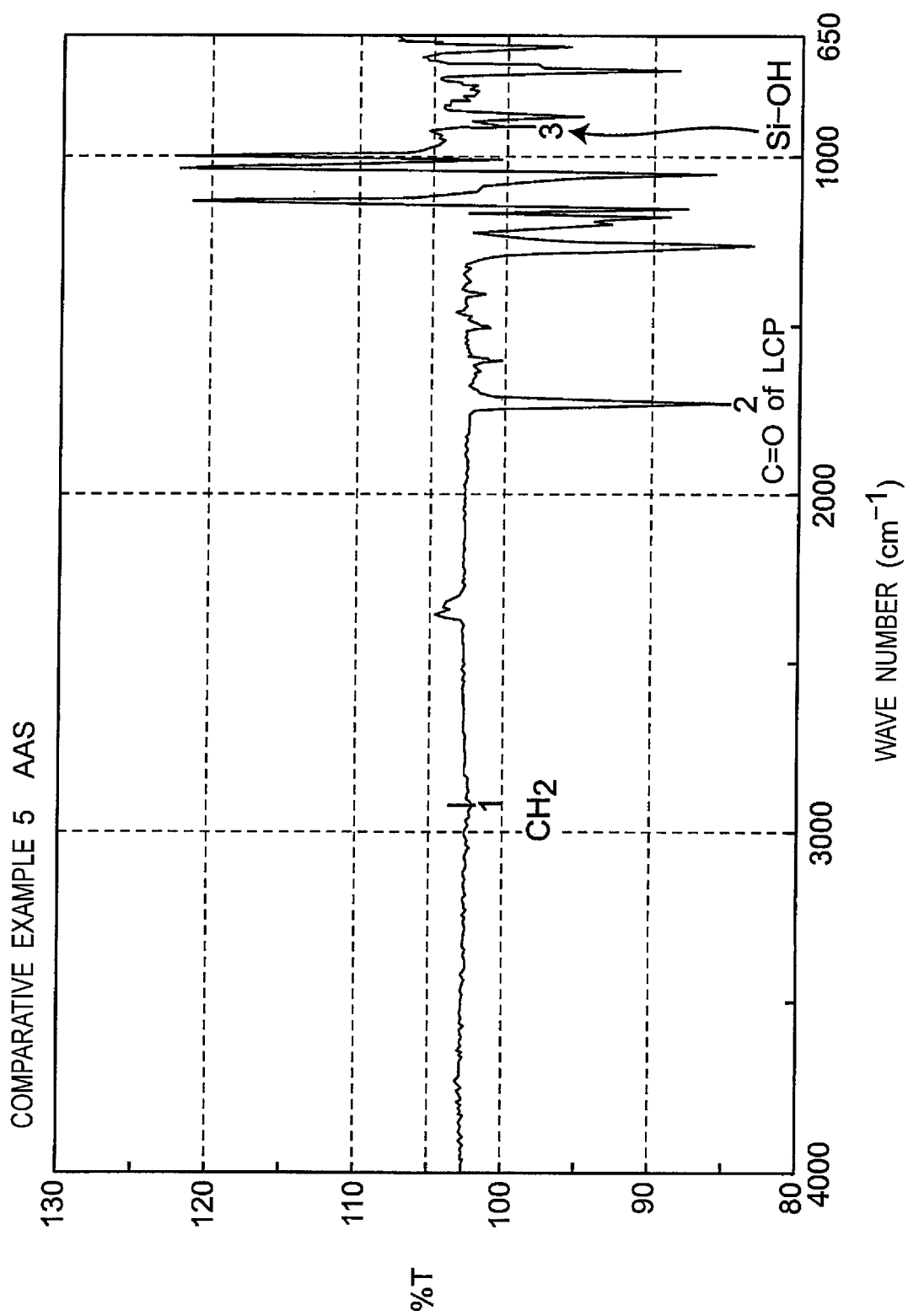
FIG. 14 is an FT-IR chart of an LPC specimen prepared from a copper-clad laminate of Comparative Example 5.
Figure 15:
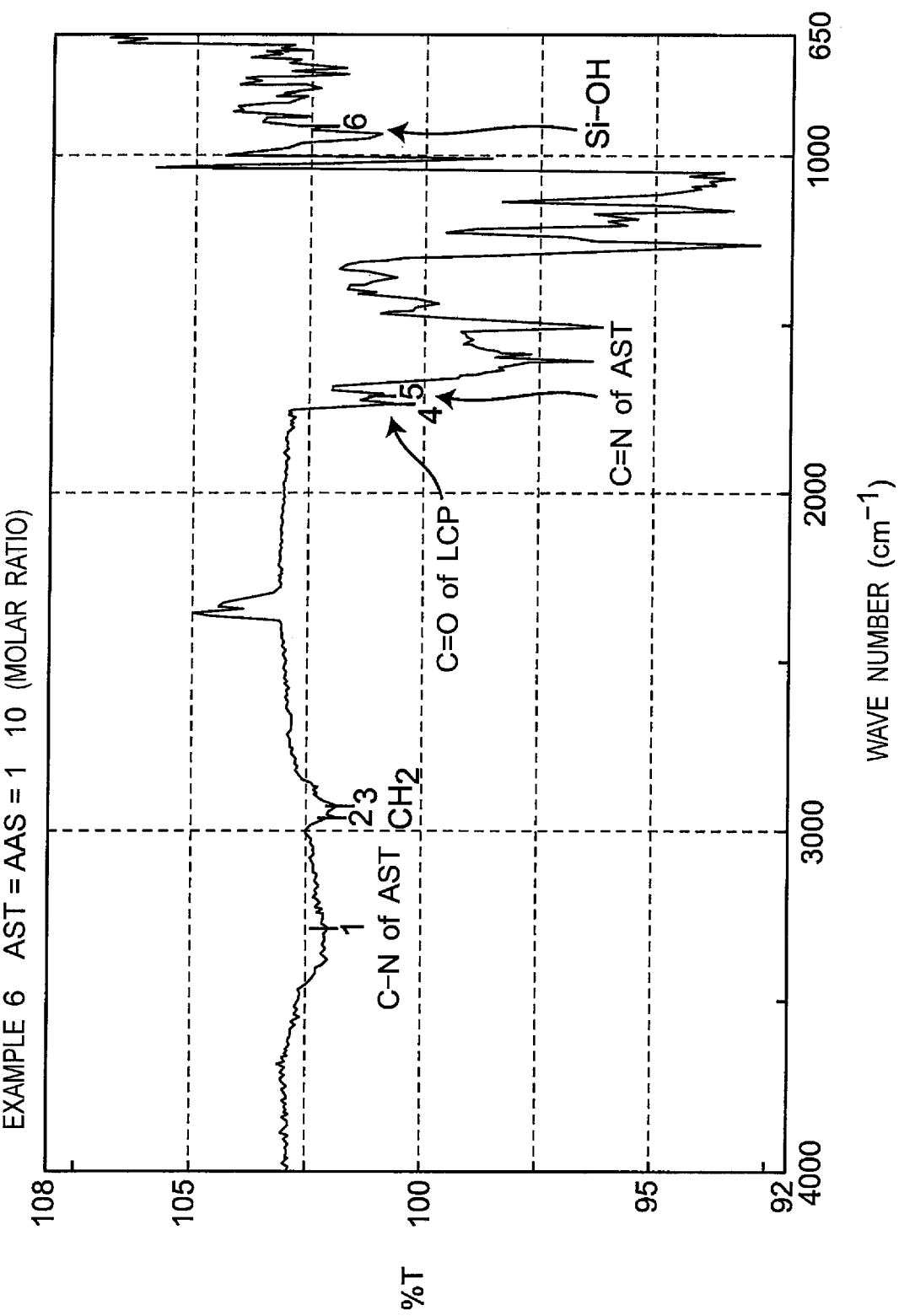
FIG. 15 is an FT-IR chart of an LPC specimen prepared from a copper-clad laminate of Example 6.

FIG. 14 is an FT-IR chart of an LPC specimen prepared from the copper-clad laminate of Comparative Example 5.

A peak of a $CH_2$ group of AAS at 2926 $cm^{-1}$ (weak), a peak of a C=O group of an ester group of the LCP film at 1735 $cm^{-1}$, and a peak of a Si—OH group of AAS at 914 $cm^{-1}$ were detected.

FIG. 15 is an FT-IR chart of an LPC specimen prepared from a copper-clad laminate of Example 6. The FT-IR chart of FIG. 15 is significantly different from those in FIGS. 13 and 14. A peak of a C—N group of a triazine ring of AST at 3295 $cm^{-1}$ and peaks of a $CH_2$ group at 2966 $cm^{-1}$ and 2926 $cm^{-1}$ are stronger than those in FIGS. 13 and 14. On the other hand, the C=O group of the ester group of the LCP film at 1735 cm$^{-1}$ is weaker than those in FIGS. 13 and 14. In addition, a peak of a C=N group of a triazine ring of AST newly appeared at 1715 cm$^{-1}$. A peak of a Si—OH group was detected at 920 cm$^{-1}$, as in FIGS. 13 and 14.

The results of FT-IR in FIGS. 13 to 15 will be discussed.

The inventors have found that the results of FT-IR are consistent with the results of the peel test of the copper-clad laminate (see Table 9), by interpreting the results of FT-IR as follows. That is, when the results are interpreted as follows, it can be logically explained that the peel strength of the example is higher than that of the comparative example. It should be noted that the effects of the present invention are not denied even in the case in which the following interpretation does not match the actual phenomenon.

In Comparative Examples 4 and 5, the peel strength between the copper foil and the LCP film was low (see Table 9). This is due to insufficient bond formation between the compound (AST or AAS) and the base material, especially bond formation between the compound and the ester structure of the LCP film. Therefore, when the copper foil was wet-etched to prepare an LPC specimen for FT-IR analysis, a part of the compound layer disposed between the copper foil and the LCP film was removed. That is, in the LPC specimen, the surface of the LCP film was partially exposed from the compound layer. As a result, in the FT-IR charts of FIGS. 13 and 14, a large peak of a C=O group of the ester group of the LCP film at 1735 cm$^{-1}$ appeared.

In contrast, in Example 6, sufficient bond (high-density bond) was formed between the compound and the ester structure of the LCP film, by using the mixed aqueous solution of AST and AAS. Therefore, the compound was not removed when the copper foil was wet-etched. That is, the LPC specimen was covered with the compound layer. As a result, in the FT-IR chart of FIG. 15, a small peak of a C=O group of the ester group of the LCP film at 1735 cm$^{-1}$ appeared. Further, a peak of a C=N group of a triazine ring of AST at 1715 cm$^{-1}$ clearly appeared (this peak did not appear in Comparative Example 4 using AST (FIG. 13)). Further, as compared with the FT-IR charts of FIGS. 13 and 14, in FT-IR chart of FIG. 15, the peak of the C—N group of the triazine ring of AST at 3295 cm$^{-1}$ derived from the compound and a peak of a CH$_2$ group at 2966 cm$^{-1}$ and 2926 cm$^{-1}$ became stronger.

From the results of the (C) FT-IR analysis (FIGS. 13 to 15), it was found that in the copper-clad laminate prepared by bonding the copper foil piece and the LCP film piece with the compound layer, the peeling strength of the copper-clad laminate can be estimated. Furthermore, it was found that the type (one or more types) of the compounds forming the compound layer can be specified or estimated by examining the positions and intensities of the peaks in the FT-IR chart in detail.

As described above, the copper metal substrate and the polyester-based resin member were able to be strongly bonded, by adding the alkane-type amine-based silane coupling agent to the compound having a cyclic molecular structure containing a nitrogen atom in combination.

As described above, from the analysis result of the bonding member in which the first compound layer including the first compound and the second compound is interposed between the metal substrate and the resin substrate, it is determined that the structure containing nitrogen of the second compound and the first compound was chemically adsorbed in a large amount on the metal substrate, and the structure of Si—OH containing no nitrogen was chemically adsorbed in a large amount on the resin substrate. That is, it is understood that in a member in which the first compound layer is formed on the metal substrate, the structure containing nitrogen is chemically adsorbed to the metal substrate, and there are many Si—OH structures on the surface of the first compound layer of the member.

As described above, the effectiveness of the first compound layer has been clarified, but in order to further improve the bonding strength, it is considered that a compound having a structure in which a Si—OH functional group having excellent chemical adsorbability to the resin substrate is contained, and simultaneously, other Si—OH functional groups on the surface of the resin substrate form a chemical bond with a Si—OH group which are present in a large amount in the first compound layer on the surface of the metal member, is applied, and in addition to the first compound layer composed of the first compound and the second compound, the second compound layer composed of the third compound which is a silane compound having two or more of alkoxysilyl groups or silanol groups is interposed between the metal substrate and the resin substrate, thereby further improving the bonding strength, and the present invention has been reached.

Embodiment 2

As the polyimide film applied to the base material for a flexible printed circuit board in Embodiment 2 of the present invention, a polyimide film manufactured by a conventionally known method can be used. That is, a film obtained by forming a polyamic acid obtained by a reaction between tetracarboxylic dianhydride and an aromatic diamine into a film and thermally or chemically imidizing the film can be used. The thickness and surface roughness of the film are not particularly limited, but it is preferred that the thickness is in a range of 10 to 100 µm and Rz is in a range of smaller than 200 nm. When the film thickness is less than 10 µm, there is a concern about reliability such as an insulating property when fabricating a fine circuit, and when the film thickness is more than 100 µm, there is a concern that the moisture absorption and dimensional stability of the film may be reduced. When the surface roughness of the film Rz is more than 200 nm, sufficient adhesion may not be obtained in bonding metals. The moisture absorption, the dimensional stability, and the like of the film can be appropriately selected depending on the application, but it is preferred that the moisture absorption is 1.0 wt % (23° C./50% RH) or less and the dimensional stability is 30 ppm (23° C., 0 to 70% RH) or less. Both are intended to maintain stability in the circuit forming process. In order to improve the adhesion of the polyimide film, it is preferred to perform a surface treatment such as a corona discharge treatment, a low-pressure plasma treatment, an atmospheric pressure plasma treatment, a flame treatment, and an ion bombardment treatment on at least one surface as a pretreatment. Among them, a corona discharge treatment is cost-effective. These surface treatments remove contamination on the polyimide film surface and uniformly form active functional groups on the surface. The wettability of the polyimide film after the surface treatment is preferably 73 dyne/cm or more.

Prepreg applied to a base material for a printed circuit board is obtained by impregnating or coating a varnish of an insulating resin composition into or on a sheet or mat of an inorganic fiber such as glass, an organic fiber such as polyimide, polyester, and tetrafluoroethylene, and a mixture thereof, and is in a semi-cured state (B-stage state). The thickness of the prepreg layer varies depending on the application, but is preferably 0.1 to 5 mm. As the resin used in the insulating resin composition, a known insulating resin used as an insulating material for a printed circuit board can be used. Generally, a thermosetting resin is used as a base due to the properties such as heat resistance and chemical resistance, and examples thereof include epoxy resins, phenol resins, cyanate resins, maleimide resins, isocyanate resins, benzocyclobutene resins, vinyl resins, and the like, but are not limited thereto. The thermosetting resin may be one type or a mixture of two or more types.

The thermosetting resin includes a resin blended with a thermoplastic resin, from the necessity of dielectric properties, impact resistance, processability, and the like. Examples of the thermoplastic resin include a fluorine resin, a polyphenylene ether resin, a modified polyphenylene ether resin, a polyphenylene sulfide resin, a polycarbonate resin, a polyetherimide resin, a polyetheretherketone resin, a polyarylate resin, a polyamide resin, a polyamideimide resin, a polybutadiene resin, and the like, but are not limited thereto. The thermoplastic resin may be a single type or a mixture of two or more types.

An inorganic filler may be mixed with the insulating resin composition. Examples of the inorganic filler include alumina, aluminum hydroxide, magnesium hydroxide, clay, talc, antimony trioxide, antimony pentoxide, zinc oxide, fused silica, glass powder, quartz powder, shirasu balloon, and the like. These inorganic fillers may be used alone or as a mixture of two or more thereof.

The insulating resin composition may contain an additive such as a flame retardant, a curing agent, a curing accelerator, thermoplastic resin particles, a coloring agent, an ultraviolet ray impermeable agent, an antioxidant, and a reducing agent, and a filler.

Other resins which can be applied to the embodiment of the present invention are polyamide-based and polyester-based resins, and may have any form and shape such as a film material, a plate material, a bar material, a tube material, and a molding material. As a polyamide-based (nylon) resin, nylon 4, nylon 6, nylon 11, nylon 12, nylon 46, nylon 66, nylon 610, nylon MXD6 (polycondensate of meta-xylylenediamine and adipic acid), and the like, and copolymers thereof, and inorganic fillers, glass fibers, or carbon fibers may be added, and blends with other polymers may be also used. As the polyester-based resin, polyethylene terephthalate, polymethylene terephthalate, polybutylene terephthalate, polyethylene naphthalate, polybutylene naphthalate, liquid crystal polymers, and the like, and copolymers thereof, and inorganic fillers, glass fibers, or carbon fibers may be added, and blends with other polymers may be also used.

A metal which can be used in the embodiment of the present invention is copper and aluminum. As the copper material, pure copper, brass, bronze, white copper, nickel silver, cupronickel, beryllium copper, and the like can be used. The copper foil may be a rolled copper foil or an electrolytic copper foil. As the aluminum material, any of 1000 series, 2000 series, 3000 series, 4000 series, 5000 series, 6000 series, 7000 series, and 8000 series can be used. As the aluminum foil, 1N39, 1085, 1N90, 1N99, 3003, 3004, 8079, 8021, and the like can be used.

The metal used in the embodiment of the present invention may be a metal which has been roughening-treated by an oxidation treatment, a reduction treatment, etching, and the like, but it is particularly preferred not to perform such a roughening treatment. The metal has a surface roughness Rz of preferably 1.5 µm or less, and more preferably 1.0 µm or less.

The thickness of the metal is not particularly limited, but in the case of a metal foil, it is preferably 300 µm or less for practical use.

At least the side of the metal in contact with the resin layer may be subjected to, for example, a surface treatment of any one of a rust prevention treatment and chromate treatment, or a combination of both. What surface treatment is performed can be appropriately selected depending on the resin.

Hereinafter, formation and bonding of a compound layer of a metal substrate and a resin substrate will be described with reference to the drawings.

<Formation of Compound Layer 20a or Compound Layers 20a and 20b of Metal Substrate>

Figure 16A:
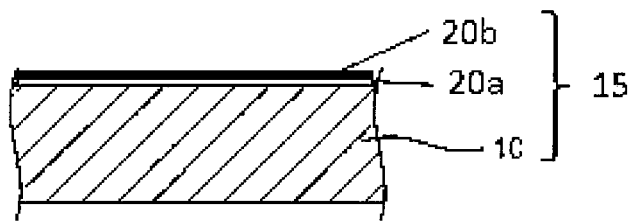
FIGS. 16(a) and 16(b) are schematic cross-sectional views of formation and bond of a compound layer of a metal substrate.

A solution containing the first compound having a nitrogen-containing functional group and a silanol group and the second compound which is an alkane-type amine-based silane coupling agent was brought into contact with the surface of a metal substrate 10. Thereafter, a heat treatment can be performed to form a first compound layer 20a. Further, if necessary, a solution containing a third compound which is a silane compound having two or more of alkoxysilyl groups or silanol groups was brought into contact with a surface of the first compound layer 20a, and thereafter, a heat treatment was performed to form a second compound layer 20b. The solution can be brought into contact with the surface of the metal substrate 10 by a known method such as coating or spraying. Thus, a metal member 15 including the compound layer 20a alone or both the compound layers 20a and 20b on the surface of the metal substrate 10 was obtained. (FIG. 16(a)).

<Formation of First Compound Layer or Second Compound Layer 20b of Resin Substrate>

Figure 17A:
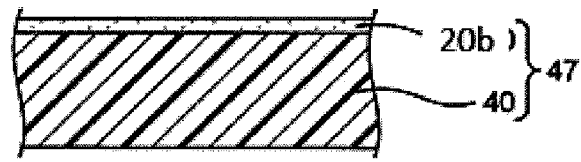
FIGS. 17(a) and 17(b) are schematic cross-sectional views of formation and bonding of a compound layer of a resin substrate.

A solution containing a first compound having a nitrogen-containing functional group and a silanol group for forming a first compound layer and a second compound which is an alkane-type amine-based silane coupling agent, or a solution containing a third compound which is a silane compound having two or more of alkoxysilyl groups or silanol groups for forming a second compound layer was brought into contact with the surface of the resin substrate 40. The solution can be brought into contact with the surface of the resin substrate 40 by a known method such as coating or spraying. Thereafter, by performing a heat treatment, the compound layer 20b of either of the first compound layer or the second compound layer can be formed on the surface of the resin substrate 40 (FIG. 17(a)). Thus, a resin member 47 including the resin substrate 40 and the compound layer 20b is obtained.

<Bonding of Metal Member 15 and Resin Substrate 40>

Figure 16B:
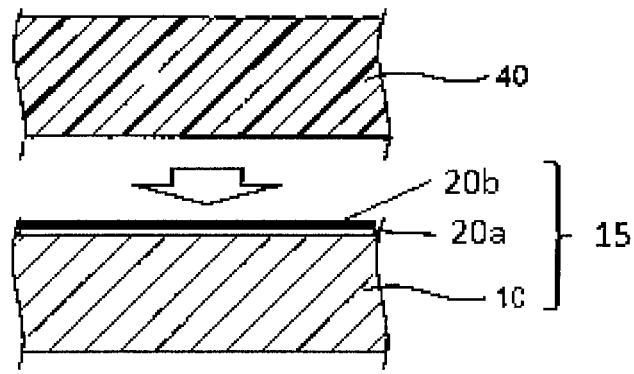

As shown in FIG. 16(b), the resin substrate 40 and the compound layer 20a and/or the compound layer 20b formed on the metal base material 10 of the metal member 15 were brought into contact with each other and pressed to bond the resin base material 40 and the metal member 15, thereby obtaining the metal article 3 as shown in FIG. 1.

Figure 17B:
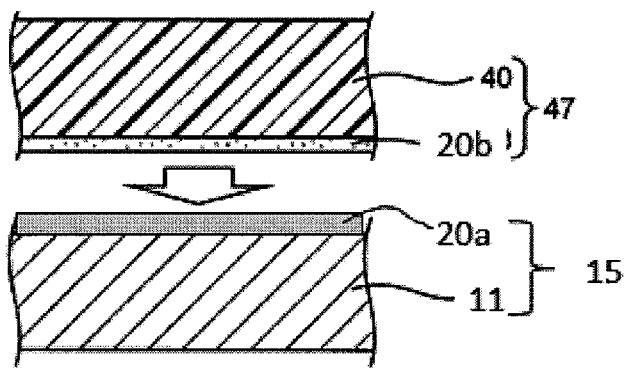

On the other hand, as shown in FIG. 17(b), the compound layer 20b of either of the first compound layer or the second compound layer on the surface of the resin base material 40 of the resin member 47, and the compound layer of the compound layer 20a formed on the metal base material 10 of the metal member 15 were brought into contact with each other and pressed to bond the resin member 47 and the metal member 15, thereby obtaining the metal article 3 as shown in FIG. 1.

Examples 8 to 10

A specimen (LCP film piece) was prepared by cutting an LCP film CT-Z (manufactured by KURARAY CO., LTD.)

having a thickness of 50 μm into a square having a side of 150 mm. Any one of a 0.05% aqueous solution of a polymer type polyfunctional group silane coupling agent forming a second compound layer (product name: X-12-972F, manufactured by Shin-Etsu Chemical Co., Ltd.), a melamine functional organosilicon compound (N,N,N-tris-(triethoxysilylpropyl) melamine, 0.03% ethanol solution), and an isocyanurate functional silicon compound (tris-(trimethoxysilylpropyl) isocyanurate, product name: KBM-9659, 0.02% isopropanol IPA solution) was applied to both surfaces of the specimen of the LCP film, using a dip coater manufactured by JSP Corporation.

A "copper foil B" (manufactured by UACJ corporation, thickness of 18 μm) was cleaned with 1% hydrochloric acid for 1 minute, then sufficiently washed with ion-exchanged water, and dried, and thereafter, the copper foil B was cut into a 150 mm square to prepare a specimen (copper foil piece). Then, a compound aqueous solution to which the first compound (AST) and the second compound (AAS) forming the first compound layer shown in the above-described Example 6 were added in a molar concentration ratio (AST:AAS=1:10, a mixed solution of 0.18% AST and 0.97% AAS) was applied to both surfaces of the specimen of the copper foil, using a dip coater manufactured by JSP Corporation.

Thereafter, the LCP film piece and the copper foil piece to which each compound solution was applied were heat-treated at 100° C. for 5 minutes. Thus, compound layers were formed on both surfaces of the LCP film piece and both surfaces of the copper foil piece.

The copper foil pieces were placed on both surfaces of the LCP film piece on which the compound layer was formed, and while pressing at a surface thickness of 4 MPa with a vacuum press manufactured by KITAGAWA SEIKI Co., Ltd., the temperature was raised to 270° C., maintained for 20 minutes, and then kept at 290° C. for 10 minutes, thereby preparing a double-sided copper-clad laminate. In this double-sided copper-clad laminate, two types of compound layers of the first and second compound layers were placed between the LCP film and the copper foil.

A specimen in a strip shape was cut out from the double-sided copper-clad laminate, the entire surface of the copper foil on the rear was removed by etching according to JIS C 6471, Section 8.1, "Peel-off strength of copper foil", and a 10 mm wide pattern remained on the test surface by etching, thereby preparing a peel test specimen. The LCP film side on the rear of the peel test specimen was fixed to a reinforcing plate with double-sided tape, the copper foil was peeled off in a 90° direction at a peel speed of 50 mm/min, using Autograph AGS-5 kNX manufactured by Shimadzu Corporation, and the peel strength was measured for three pieces at one time under each condition. The minimum and maximum values were read from the peel test chart. Table 10 shows the results.

TABLE 10

| Example | Compound name | Peel strength (kN/m) | |
|---|---|---|---|
| | | Minimum | Maximum |
| 8 | Polymer type polyfunctional group silane coupling agent | 0.68 | 0.72 |
| 9 | melamine functional organosilicon compound | 0.75 | 0.82 |
| 10 | isocyanurate functional silicon compound | 0.78 | 1.24 |
| 6 | AST + AAS | 0.70 | 0.73 |

The number of alkoxysilyl groups or silanol groups per a compound molecule used in the examples is large in the polymer type polyfunctional group silane coupling agent X-12-972F, three in the melamine functional organosilicon compound N,N,N-tris-(triethoxysilylpropyl) melamine, and three in the isocyanurate functional silicon compound KBM-9659.

Table 10 shows that upon comparison with the minimum value of 0.70/the maximum value of 0.73 kN/m of the peel test strength in the case of only the first compound layer of the mixed solution of AST and AAS of Example 6, the minimum value of 0.68/maximum value of 0.72 kN/m of the second compound layer being the polymer type polyfunctional group silane coupling agent is almost equivalent, and both the minimum value of 0.75/the maximum value of 0.82 kN/m of the melamine functional organosilicon compound and the minimum value of 0.78/the maximum value of 1.24 kN/m of the isocyanurate functional silicon compound are higher than the peel strength of the mixed solution of AST and AAS.

It was shown that the bonding strength can be improved by forming a layer of a silane compound having two or more of alkoxysilyl groups or silanol groups on the polyester resin.

Examples 11 to 16 and Comparative Examples 6 and 7

In the present embodiment, in addition to forming the first compound layer of the first compound (AST) and the second compound (AAS) on a metal, as the silane compound having two or more of alkoxysilyl groups or silanol groups which becomes the second compound layer formed on the resin surface, a polymer type polyfunctional group silane coupling agent was selected. In the test of the polyester-based resin, for the silane compound having two or more silanol groups, the effects of improving the peel strength of three types of compounds having different structures were compared, as shown in Table 10, and among them, the compound which had the result closest to the effect of improving the peel strength of the first compound layer composed of the first compound (AST) and the second compound (AAS) was the polymer type polyfunctional group silane coupling agent and had a somewhat small effect as compared with other types of compounds, but since it was determined that if this compound exhibited the effect, compounds having other structures also had the effect, the polymer type polyfunctional group silane coupling agent was selected in the present example.

A polyimide film having a thickness of 50 μm (product name: Kapton 200EN, manufactured by DU PONT-TORAY CO., LTD.), a nylon film (product name: Emblem ON, manufactured by UNITIKA LTD.), and epoxy prepreg (product name: epoxy resin impregnated tape, manufactured by Teraoka Seisakusho Co., Ltd.) were used to prepare a specimen which was cut into a 150 mm square for each test.

The polyimide film and the nylon film were corona discharge-treated as a pretreatment, and 0.1% normal propanol solution of a polymer type polyfunctional group silane coupling agent (product name: X-12-972F, manufactured by Shin-Etsu Chemical Co., Ltd.) was applied to both surfaces of the specimen of the film, using a dip coater manufactured by JSP Corporation. The compound solution was not applied to the surface of the prepreg.

The copper foil B (manufactured by UACJ corporation, thickness of 18 μm) was cut into a 150 mm square, cleaned with alcohol, and dried to prepare a specimen. Then, a compound aqueous solution to which the first compound (AST) and the second compound (AAS) shown in the above-described Example 6 were added in a molar concentration ratio (AST:AAS=1:10, a mixed solution of 0.18% AST and 0.97% AAS) and mixed, was applied to both surfaces of the specimen of the copper foil, using a dip coater manufactured by JSP Corporation.

An aluminum foil (manufactured by TOYO ALUMINIUM K.K., thickness of 50 μm) was cut into a 150 mm square, immersed in a 3% aqueous solution of a degreasing solution (product name: GC26M, manufactured by MILLION CHEMICALS CO., LTD.) for 1 minute (60° C.), and washed with water and dried to prepare a specimen. Then, a compound aqueous solution in which the first compound (AST) and the second compound (AAS) were mixed was applied to both surfaces of the specimen, in the same manner as the copper foil, using a dip coater manufactured by JSP Corporation.

Thereafter, the film piece and the copper foil piece to which each compound solution was applied were heat-treated at 100° C. for 5 minutes. Thus, compound layers were formed on both surfaces of the film piece excluding the prepreg and both surfaces of the copper foil piece.

The copper foil of Example 14 was coated with a mixed aqueous solution of the first compound (AST) and the second compound (AAS), heat-treated as described above, further coated with a 0.2% normal propanol solution of a polymer type polyfunctional group silane coupling agent (product Name: X-12-972F, manufactured by Shin-Etsu Chemical Co., Ltd.), and heat-treated at 100° C. for 5 minutes.

As the comparative example, a specimen in which the chemical was not applied to both the metal foil and the film surface was prepared.

The copper foil piece was placed on both surfaces of the film piece on which the compound layer was formed, and in the case of the polyimide film, the copper foil piece was kept at 250° C. for 10 minutes while being pressed at a surface thickness of 10 MPa with a vacuum press manufactured by KITAGAWA SEIKI Co., Ltd., thereby preparing a double-sided copper-clad laminate. Lamination was performed at a surface pressure of 4 MPa at 200° C. for 90 minutes in the case of the prepreg, and at a surface pressure of 4 MPa at 200° C. for 10 minutes in the case of a nylon film. In these double-sided copper-clad laminates, each compound layer was placed between the film and the copper foil.

In the comparative example, no compound layer existed between the film and the copper foil.

A specimen in a strip shape was cut out from the double-sided copper-clad laminate, the entire surface of the copper foil on the rear was removed by etching according to JIS C 6471, Section 8.1, "Peel-off strength of copper foil", and a 10 mm wide pattern remained on the test surface by etching, thereby preparing a peel test specimen. The resin side on the rear of the peel test specimen was fixed to a reinforcing plate with double-sided tape, the copper foil was peeled off in a 90° direction at a peel speed of 50 mm/min, using Autograph AGS-5 kNX manufactured by Shimadzu Corporation, and the peel strength was measured for three pieces at one time under each condition. The minimum and maximum values were read from the peel test chart. Table 11 shows the results of the examples, and Table 12 shows the results of the comparative examples.

TABLE 11

| Example | Compound name Metal foil | Resin material | Peel strength (kN/m) Minimum | Maximum |
|---|---|---|---|---|
| 11 | Copper foil B 18 μm AST + AAS | Polyimide film 50 μm — | 0.32 | 0.50 |
| 12 | Copper foil B 18 μm AST + AAS | Polyimide film 50 μm Polymer type polyfunctional group silane coupling agent | 0.60 | 0.70 |
| 13 | Copper foil B 18 μm AST + AAS | Epoxy prepreg 100 μm — | 0.40 | 0.43 |
| 14 | Copper foil B 18 μm AST + AAS/ Polymer type polyfunctional group silane coupling agent | Epoxy prepreg 100 μm — | 0.51 | 0.55 |
| 15 | Aluminum foil 50 μm AST + AAS | Nylon film 25 μm — | 0.74 | 1.45 |
| 16 | Aluminum foil 50 μm AST + AAS | Nylon film 25 μm Polymer type polyfunctional group silane coupling agent | Film rupture | |

TABLE 12

| Comparative Example | Compound name Metal foil | Resin material | Peel strength (kN/m) Minimum | Maximum |
|---|---|---|---|---|
| 6 | Copper foil B 18 μm — | Polyimide film 50 μm — | Not bonded | |
| 7 | Copper foil B 18 μm — | Epoxy prepreg 100 μm — | 0.10 | 0.13 |
| 8 | Aluminum foil 50 μm — | Nylon film 25 μm — | Not bonded | |

Regarding the bonding of the copper foil and the polyimide film, in Comparative Example 6 in which the compound was not applied to any of the members, the copper foil and the polyimide film were not bonded at all, but when the first compound layer of the first compound (AST) and the second compound (AAS) was formed only to the copper foil of Example 11, the peel strength was shown as the minimum value of 0.32 kN/m/the maximum value of 0.50 kN/m, and thus, the effect of the first compound layer of the first compound (AST) and the second compound (AAS) was confirmed. When the second compound layer was formed on the polyimide film in addition to the copper foil of Example 12 by the polymer type polyfunctional group silane coupling agent, the peel strength was further improved as compared with the case in which only the mixed compound of the first compound (AST) and the second compound (AAS) was formed in Example 11 and shown as the minimum value of 0.60 kN/m/the maximum value of 0.70 kN/m.

In the case of the prepreg, when the compound was not applied to any member of Comparative Example 7, the peel strength was the minimum value of 0.10 kN/m/the maximum value of 0.13 kN/m, which are very low numerical values. In a printed circuit board in which a copper foil is laminated on prepreg, a sufficient peel strength can be obtained by roughening the surface of the copper foil, generally as a copper foil having a roughened surface being used, but in this test, it is considered that only such a low peel strength was obtained due to the use of a rolled copper foil having a smooth surface. Example 13 shows a case in which a mixed compound of the first compound (AST) and the second compound (AAS) was applied to the surface of the copper foil. As in the case of the polyimide film, the effect of improving the peel strength was observed, and the minimum value of 0.40 kN/m/the maximum value of 0.43 kN/m was shown. In Example 14, it was shown that a mixed compound of the first compound (AST) and the second compound (AAS) was applied to the surface of the copper foil to form the first compound layer, and further, the polymer type polyfunctional group silane coupling agent was applied thereto to form the second compound layer. When a compound is applied to the prepreg, curing of the prepreg proceeds before lamination by a heat treatment required after the application of the compound, and thus, application is not possible. Therefore, two types of compounds were coated in an overlapping manner on the copper foil to form a compound layer. The peel strength at this time was 0.51 kN/m at the minimum/0.55 kN/m at the maximum, and the strength was improved with a small difference as compared with the case in which only the mixed compound of the first compound (AST) and the second compound (AAS) was applied on the surface of the copper foil of Example 13. When the specimen after the peel test of Example 14 was observed, since the adhesion of the epoxy resin to the surface of the copper foil was seen, it is determined that the measured peel strength was close to the limit value of the prepreg. Therefore, two types of compound layers can be formed on the metal and resin surfaces, respectively, like the metal and the polyimide film shown above, but it was also shown to be effective to coat the two types of compounds in an overlapping manner to form the compound layer as such.

The case using aluminum as a metal and a nylon resin as a resin was examined. In Comparative Example 8, the peel strength measurement results when no compound layer was formed on either of the metal or the resin were shown, but there was no bonding. When the mixed compound layer of the first compound (AST) and the second compound (AAS) was formed only on the aluminum foil as in Example 15, the minimum and maximum values of the peel strength were 0.75 kN/m and 1.45 kN/m, respectively, and in this case also, the effectiveness of the first compound layer of the first compound (AST) and the second compound (AAS) was confirmed. Further, Example 16 shows the peel strength when the second compound layer composed of a polymer type polyfunctional group silane coupling agent was formed on the nylon film surface. In this case, though the peel strength was not able to be clearly found due to the rupture of the nylon film in the peel test, it is clear that the peel strength is higher than the case in which the first compound layer of the first compound (AST) and the second compound (AAS) was formed on the surface of the aluminum foil.

As described above, it was confirmed that in bonding of a metal and a resin, the first compound layer composed of the first compound (AST) and the second compound (AAS) was formed at the bonding interface between the metal and the resin to have an effectiveness to improvement of the peel strength, and further, the second compound layer composed of the silane compound having two or more of alkoxysilyl groups or silanol groups was added to the bonding interface between the metal and the resin to increase adhesion between the metal and the resin, thereby further improving the peel strength.

The disclosure of the present specification may include the following aspects.

(Aspect 1)

A metal article including:
a metal substrate;
a resin substrate; and
a compound layer for bonding the metal substrate and the resin substrate,
in which the compound layer is a compound layer (a first compound layer) including:
a first compound having a nitrogen-containing functional group and a silanol group; and
a second compound which is an alkane-type amine-based silane coupling agent.

(Aspect 2)

The metal article according to Aspect 1, further including:
a second compound layer including a third compound which is a silane compound having two or more of alkoxysilyl or silanol groups.

(Aspect 3)

The metal article according to Aspect 1 or 2, in which
the metal of the metal substrate is at least one selected from the group consisting of copper, aluminum, iron, stainless steel, nickel, zinc, and alloys thereof.

(Aspect 4)

The metal article according to any one of Aspects 1 to 3, in which
a resin of the resin substrate is a thermoplastic resin or a thermosetting resin,
the thermoplastic resin is at least one selected from the group consisting of a polyester resin, a polyimide resin, a polyamide resin, an ABS resin, a polycarbonate resin, a polyolefin resin, a polystyrene resin, a vinyl chloride resin, an acryl resin, and a compounded or blended substance containing these resins and another polymer, and
the thermosetting resin is at least one selected from the group consisting of an epoxy resin, a phenol resin, a cyanate resin, a maleimide resin, an isocyanate resin, a benzocyclobutene resin, and a compounded or blended substance containing these resins and another polymer.

(Aspect 5)

The metal article according to any one of Aspects 1 to 4, in which
each of the first compound, the second compound, and the third compound is a compound containing no sulfur atom.

(Aspect 6)

The metal article according to any one of Aspects 1 to 5, in which
the first compound is represented by the following formula:

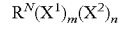

where $R^N$ is a 5-membered or 6-membered nitrogen heterocycle,
each $X^1$ is identical or different, and $X^1$ is a monovalent organic group having a silanol group or an alkoxysilyl group,
each $X^2$ is identical or different, and $X^2$ is a monovalent organic group having no silicon atom, and
m is a number from 1 to 3, n is a number from 1 to 3, and a sum of m and n is the number of carbon atoms in the nitrogen heterocycle.

(Aspect 7)

The metal article according to any one of Aspects 1 to 6, in which the second compound is a compound represented by the following formula:

where $R^{11}$ is a monovalent organic group which optionally has a substituent, and $X^{11}$ is a monovalent organic group having a silanol group or an alkoxysilyl group.

(Aspect 8)

The metal article according to any one of Aspects 1 to 7, in which the third compound is at least one selected from the group consisting of polymer type polyfunctional group silane coupling agents, melamine functional organosilicon compounds, and isocyanurate functional silicon compounds.

(Aspect 9)

The metal article according to any one of Aspects 1 to 8, in which amounts of the first compound and the second compound are 1:0.2 to 1:50 as a molar ratio, or 1:0.2 to 0.1:8 as a weight ratio.

(Aspect 10)

The metal article according to any one of Aspects 1 to 9, in which amounts of the first compound and the second compound are 1:16 to 0.1:45 as a % by weight ratio, and an amount of the third compound is 1 to 1000 parts by weight, with respect to 100 parts by weight in total of the first compound and the second compound.

(Aspect 11)

The metal article according to any one of Aspects 1 to 10, in which a surface roughness Ra of the metal substrate is 0.1 μm or less.

(Aspect 12)

The metal article according to any one of Aspects 1 to 11, in which an oxide layer and a rust inhibitor layer are not present on a surface of the metal substrate.

(Aspect 13)

A method of manufacturing the metal article described in Aspect 1, the metal article including a metal substrate, a resin substrate, and a compound layer bonding the metal substrate and the resin substrate, wherein a compound layer including a first compound and a second compound is formed between the metal substrate and the resin substrate, wherein the first compound has a nitrogen-containing functional group and a silanol group, and the second compound is an alkane-type amine-based silane coupling agent.

(Aspect 14)

A method of manufacturing the metal article according to Aspect 2, the metal article including a metal substrate, a resin substrate, and a compound layer bonding the metal substrate and the resin substrate, wherein a first compound layer including a first compound and a second compound and a second compound layer including a third compound are formed between the metal substrate and the resin substrate, wherein the first compound having a nitrogen-containing functional group and a silanol group, the second compound which is an alkane-type amine-based silane coupling agent, and the third compound which is a silane compound having two or more of alkoxysilyl groups or silanol groups.

(Aspect 15)

The method of manufacturing the metal article according to Aspect 13 or 14, the method including:

bringing a solution containing a compound and an alkane-type amine-based silane coupling agent into contact with a surface of a resin substrate and then performing heating to obtain a resin member having a compound layer, wherein the compound has a nitrogen-containing functional group and a silanol group; and bonding the metal substrate and the resin substrate.

(Aspect 16)

The method of manufacturing the metal article described in Aspect 2, the method including:

bringing a solution containing a silane compound having two or more of alkoxysilyl or silanol groups into contact with a surface of a resin substrate and then performing heating to obtain a resin member having a compound layer; and bonding the metal substrate and the resin substrate.

(Aspect 17)

The method of manufacturing the metal article according to any one of Aspects 13 to 16, the method including:

cleaning the metal substrate with an acid aqueous solution;

bringing a solution containing a compound and an alkane-type amine-based silane coupling agent into contact with a surface of the metal substrate and then performing heating to obtain a metal member having a compound layer, wherein the compound has a nitrogen-containing functional group and a silanol group; and bonding the metal substrate and a resin substrate.

(Aspect 18)

A method of manufacturing the metal article described in Aspect 2, the method including:

obtaining a metal member having a first compound layer and a second compound layer in an overlapping manner, wherein a first compound layer is formed by bringing a solution containing a compound having a nitrogen-containing functional group and a silanol group and an alkane-type amine-based silane coupling agent into contact with a surface of a metal substrate and then performing heating and a second compound layer is formed by bringing a solution containing a silane compound having two or more of alkoxysilyl or silanol groups into contact with the first compound layer, and then performing heating; and bonding the metal substrate and the resin substrate.

(Aspect 19)

A metal member including a metal substrate and a compound layer provided on a surface of the metal substrate, in which the compound layer includes:
    a first compound having a nitrogen-containing functional group and a silanol group; and
    a second compound which is an alkane-type amine-based silane coupling agent.

(Aspect 20)

A metal member including a metal substrate and a compound layer provided on a surface of the metal substrate, in which the compound layer includes:
    a first compound layer including: a first compound having a nitrogen-containing functional group and a silanol group; and a second compound which is an alkane-type amine-based silane coupling agent; and
    a second compound layer including a third compound which includes a silane compound having two or more of alkoxysilyl or silanol groups.

(Aspect 21)

The method of manufacturing a metal member including a metal substrate and a compound layer provided on a surface of the metal substrate, the method including:

cleaning the metal substrate with an acid aqueous solution;

bringing a solution containing a compound and an alkane-type amine-based silane coupling agent into contact with a surface of the metal substrate and then performing heating, wherein the compound has a nitrogen-containing functional group and a silanol group.

(Aspect 22)

A method of manufacturing a metal member including a metal substrate and a compound layer provided on a surface of the substrate, the method including:

cleaning the substrate with an acid aqueous solution; and bringing a solution containing a compound and an alkane-type amine-based silane coupling agent into contact with a surface of the metal substrate and then performing heating to form a first compound layer, wherein the compound has a nitrogen-containing functional group and a silanol group, and bringing a solution containing a silane compound having two or more of alkoxysilyl or silanol groups into contact with a surface of the first compound layer and then performing heating to form a second compound layer in an overlapping manner.

(Aspect 23)

A resin member including a resin substrate and a compound layer provided on a surface of the resin substrate, in which the compound layer includes:

a first compound having a nitrogen-containing functional group and a silanol group; and a second compound which is an alkane-type amine-based silane coupling agent.

(Aspect 24)

A resin member including: a resin substrate and a compound layer provided on a surface of the resin substrate, in which the compound layer includes a silane compound having two or more of alkoxysilyl or silanol groups.

(Aspect 25)

A method of manufacturing a resin member including a resin substrate and a compound layer provided on a surface of the resin substrate, the method including:

bringing a solution containing a compound and an alkane-type amine-based silane coupling agent into contact with a surface of the resin substrate and then performing heating, wherein the compound has a nitrogen-containing functional group and a silanol group.

INDUSTRIAL APPLICABILITY

The present invention can be used in a metal article in which a metal and a resin are bonded. The Metal article can be used for electronic device components, for example, printed circuit boards; daily necessities such as foods, cosmetics, and pharmaceuticals; and packaging materials for a lithium ion battery and the like.

REFERENCE SIGNS LIST

3: Copper alloy article
10: Copper alloy substrate
15: Copper alloy member
20: Compound layer
40: Polyester-based resin substrate
47: Polyester-based resin member
50: Hydrogen peroxide solution

The invention claimed is:

1. A metal article comprising:

a metal substrate;

a resin substrate; and a compound layer for bonding the metal substrate and the resin substrate, wherein the compound layer is a first compound layer consisting of:

a first compound having a nitrogen-containing functional group and a silanol group, the first compound being represented by formula:

$$R^N(X^1)_m(X^2)_n$$

where $R^N$ is a 5-membered or 6-membered nitrogen heterocycle, each $X^1$ is identical or different, and $X^1$ is a monovalent organic group having a silanol group or an alkoxysilyl group, each $X^2$ is identical or different, and $X^2$ is a hydrogen atom or a monovalent organic group having no silicon atom, and m is a number from 1 to 3, n is a number from 1 to 3, and a sum of m and n is the number of carbon atoms in the nitrogen heterocycle; and a second compound which is an alkane-type amine-based silane coupling agent, the second compound being a compound represented by formula:

$$R^{11}-X^{11}$$

where $R^{11}$ is a monovalent organic group having an amino group, and $X^{11}$ is a monovalent organic group having a silanol group or an alkoxysilyl group, wherein the first compound contains no sulfur atom, and wherein amounts of the first compound and the second compound are 1:0.2 to 0.1:45 as a weight ratio.

2. The metal article according to claim 1, wherein a metal for the metal substrate is at least one selected from the group consisting of copper, aluminum, iron, stainless steel, nickel, zinc, and alloys thereof.

3. The metal article according to claim 1, wherein amounts of the first compound and the second compound are 1:0.2 to 1:50 as a molar ratio, or 1:0.2 to 0.1:8 as a weight ratio.

4. The metal article according to claim 1, wherein a surface roughness Ra of the metal substrate is 0.1 μm or less.

5. The metal article according to claim 1, wherein an oxide layer and a rust inhibitor layer are not present on a surface of the metal substrate.

6. The metal article according to claim 1, further comprising:

a second compound layer including a third compound which is a silane compound having two or more of alkoxysilyl or silanol groups, the third compound being at least one selected from the group consisting of polymer type polyfunctional group silane coupling agents, melamine functional organosilicon compounds, and isocyanurate functional silicon compounds.

7. The metal article according to claim 6, wherein in the third compound, the polymer type polyfunctional group silane coupling agent is a compound having a repeating unit represented by formula:

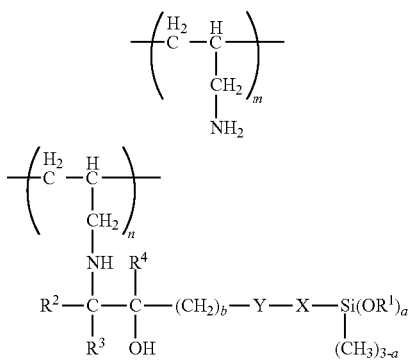

where m is 10≤m≤260 and n is 1≤n≤100,
$R^1$ is a hydrogen atom, an alkyl group having 1 to 4 carbon atoms, or an acetyl group,
a and b are integers of 1 to 3,
X is an alkylene chain having 1 to 10 carbon atoms which optionally has a substituent, the substituent being an alkyl group having 1 to 6 carbon atoms,
Y represents a direct bond, an oxygen atom, or a $CHR^5$ group, and
$R^2$, $R^3$, $R^4$, and $R^5$ represent a hydrogen atom or an alkyl group having 1 to 6 carbon atoms, but $R^3$ or $R^4$ and $R^5$ are optionally bonded to form a saturated carbocycle;
the melamine functional organosilicon compound is a compound represented by formula:

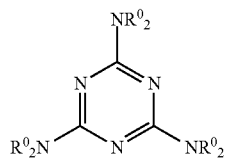

where $R^0$ is independently a hydrogen atom, or a monovalent hydrocarbon group which is optionally interrupted by a heteroatom selected from the group consisting of an oxygen atom, a sulfur atom, and a nitrogen atom or by a carbonyl carbon and which optionally has a substituent, and
at least one of $R^0$ is a monovalent organic group having a silanol group or an alkoxysilyl group; and
the isocyanurate functional silicon compound is a compound represented by formula:

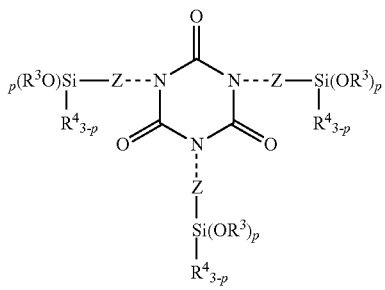

where Z is a divalent hydrocarbon group which is optionally interrupted by a heteroatom selected from the group consisting of an oxygen atom, a sulfur atom, and a nitrogen atom or by a carbonyl carbon and which optionally has a substituent,
$R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3.

8. The metal article according to claim 6, wherein each of the second compound and the third compound is a compound containing no sulfur atom.

9. The metal article according to claim 6, wherein an amount of the third compound is 1 to 1000 parts by weight, with respect to 100 parts by weight in total of the first compound and the second compound.

10. A method of manufacturing the metal article of claim 6, wherein
a first compound layer including a first compound and a second compound and a second compound layer including a third compound are formed between a metal substrate and a resin substrate.

11. The method of manufacturing the metal article according to claim 10, the method comprising:
bringing a solution containing the first compound and the second compound into contact with a surface of the metal substrate and then performing heating to obtain a metal member having the first compound layer;
bringing a solution containing the third compound into contact with a surface of the resin substrate and then performing heating to obtain a resin member having the second compound layer; and
bonding the metal member and the resin member.

12. The method of manufacturing the metal article according to claim 10, the method comprising:
obtaining a metal member having the first compound layer and the second compound layer in an overlapping manner, wherein the first compound layer is formed by bringing the solution containing the first compound and the second compound into contact with a surface of the metal substrate and then performing heating, and the second compound layer is formed by bringing the solution containing the third compound into contact with the first compound layer and then performing heating; and
bonding the metal member and the resin substrate.

13. The metal article according to claim 1, wherein
a resin for the resin substrate is a thermoplastic resin or a thermosetting resin,
the thermoplastic resin is at least one selected from the group consisting of a polyester resin, a polyimide resin, a polyamide resin, an ABS resin, a polycarbonate resin, a polyolefin resin, a polystyrene resin, a vinyl chloride resin, an acryl resin, and a compounded or blended substance containing these resins and another polymer, and
the thermosetting resin is at least one selected from the group consisting of an epoxy resin, a phenol resin, a cyanate resin, a maleimide resin, an isocyanate resin, a benzocyclobutene resin, and a compounded or blended substance containing these resins and another polymer.

14. The metal article according to claim 13, wherein
in the first compound,
each $X^1$ is identical or different, and $X^1$ is a group represented by Structure (A):

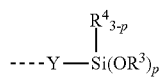

(A)

where Y is a divalent hydrocarbon group which is optionally interrupted by a heteroatom selected from the group consisting of an oxygen atom and a nitrogen atom or by a carbonyl carbon and which optionally has a substituent,
$R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3; and
each $X^2$ is identical or different, and $X^2$ is a hydrogen atom or a hydrocarbon group.

15. The metal article according to claim 14, wherein in the second compound,
$R^{11}$ is a hydrocarbon group having an amino group,
$X^{11}$ is a group represented by Structure (B):

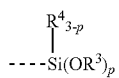

(B)

where $R^3$ is a hydrogen atom or an unsubstituted or substituted alkyl group having 1 to 4 carbon atoms,
$R^4$ is an unsubstituted or substituted alkyl group having 1 to 4 carbon atoms, and
p is an integer of 1 to 3.

16. The metal article according to claim 14, wherein the second compound is at least one selected from the group consisting of N-2-(aminoethyl)-3-aminopropylmethyldimethoxysilane, N-2-(aminoethyl)-3-aminopropyltrimethoxysilane, 3-aminopropyltrimethoxysilane, and 3-aminopropyltriethoxysilane.

17. A method of manufacturing the metal article of claim 1, wherein
a first compound layer including a first compound and a second compound is formed between a metal substrate and a resin substrate.

18. The method of manufacturing the metal article according to claim 17, the method comprising:
bringing a solution containing the first compound and the second compound into contact with a surface of the resin substrate and then performing heating to obtain a resin member having the first compound layer; and
bonding the metal substrate and the resin member.

19. The method of manufacturing the metal article according to claim 17, the method further comprising:
cleaning the metal substrate with an acid aqueous solution.

20. A metal member comprising: a metal substrate and a first compound layer provided on a surface of the metal substrate, wherein
the compound layer consists of:
a first compound having a nitrogen-containing functional group and a silanol group; and
a second compound which is an alkane-type amine-based silane coupling agent,
wherein the first compound contains no sulfur atom,
wherein the first compound is represented by formula:

$R^N(X^1)_m(X^2)_n$ where $R^N$ is a 5-membered or 6-membered nitrogen heterocycle,
each $X^1$ is identical or different, and $X^1$ is a monovalent organic group having a silanol group or an alkoxysilyl group,
each $X^2$ is identical or different, and $X^2$ is a hydrogen atom or a monovalent organic group having no silicon atom, and
m is a number from 1 to 3, n is a number from 1 to 3, and a sum of m and n is the number of carbon atoms in the nitrogen heterocycle, and
wherein the second compound is a compound represented by formula:

$R^{11}-X^{11}$ where $R^{11}$ is a monovalent organic group having an amino group, and
$X^{11}$ is a monovalent organic group having a silanol group or an alkoxysilyl group.

21. A method of manufacturing the metal member of claim 20, the method comprising:
cleaning a metal substrate with an acid aqueous solution; and
bringing a solution containing a first compound and a second compound into contact with a surface of the metal substrate and then performing heating.

22. A metal member comprising: a metal substrate and a compound layer provided on a surface of the metal substrate, wherein
the compound layer includes:
a first compound layer consists of: a first compound having a nitrogen-containing functional group and a silanol group; and a second compound which is an alkane-type amine-based silane coupling agent; and
a second compound layer including a third compound which is a silane compound having two or more of alkoxysilyl or silanol groups,
wherein the first compound contains no sulfur atom,
wherein the first compound is represented by formula:

$R^N(X^1)_m(X^2)_n$ where $R^N$ is a 5-membered or 6-membered nitrogen heterocycle,
each $X^1$ is identical or different, and $X^1$ is a monovalent organic group having a silanol group or an alkoxysilyl group,
each $X^2$ is identical or different, and $X^2$ is a hydrogen atom or a monovalent organic group having no silicon atom, and
m is a number from 1 to 3, n is a number from 1 to 3, and a sum of m and n is the number of carbon atoms in the nitrogen heterocycle,
wherein the second compound is a compound represented by formula:

$R^{11}-X^{11}$ where $R^{11}$ is a monovalent organic group having an amino group, and
$X^{11}$ is a monovalent organic group having a silanol group or an alkoxysilyl group, and
wherein the third compound is at least one selected from the group consisting of polymer type polyfunctional group silane coupling agents, melamine functional organosilicon compounds, and isocyanurate functional silicon compounds.

23. A method of manufacturing the metal member of claim 22, the method comprising:
cleaning the substrate with an acid aqueous solution; and
bringing a solution containing a first compound and a second compound into contact with a surface of the metal substrate and then performing heating to form a first compound layer, and bringing a solution containing a third compound which is a silane compound having two or more of alkoxysilyl or silanol groups into contact with a surface of the first compound layer and then performing heating to form a second compound layer in an overlapping manner.

24. A resin member comprising: a resin substrate and a first compound layer provided on a surface of the resin substrate, wherein
the compound layer consists of:
a first compound having a nitrogen-containing functional group and a silanol group; and
a second compound which is an alkane-type amine-based silane coupling agent,
wherein the first compound contains no sulfur atom,
wherein the first compound is represented by formula:

$R^N(X^1)_m(X^2)_n$ where $R^N$ is a 5-membered or 6-membered nitrogen heterocycle,
each $X^1$ is identical or different, and $X^1$ is a monovalent organic group having a silanol group or an alkoxysilyl group,
each $X^2$ is identical or different, and $X^2$ is a hydrogen atom or a monovalent organic group having no silicon atom, and
m is a number from 1 to 3, n is a number from 1 to 3, and a sum of m and n is the number of carbon atoms in the nitrogen heterocycle, and
wherein the second compound is a compound represented by formula:

$R^{11}\text{—}X^{11}$ where $R^{11}$ is a monovalent organic group having an amino group, and
$X^{11}$ is a monovalent organic group having a silanol group or an alkoxysilyl group.

25. A method of manufacturing the resin member of claim 24, the method comprising:
bringing a solution containing a first compound and a second compound into contact with a surface of a resin substrate and then performing heating.

* * * * *